(12) United States Patent
Gilbert et al.

(10) Patent No.: US 9,837,483 B2
(45) Date of Patent: Dec. 5, 2017

(54) NANOSCALE HIGH-PERFORMANCE TOPOLOGICAL INDUCTOR

(71) Applicant: The Board of Trustees of the University of Illinois, Urbana, IL (US)

(72) Inventors: Matthew J. Gilbert, Champaign, IL (US); Timothy M. Philip, Champaign, IL (US); Daniel Somerset Green, McLean, VA (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 15/405,079

(22) Filed: Jan. 12, 2017

(65) Prior Publication Data
US 2017/0207294 A1 Jul. 20, 2017

Related U.S. Application Data

(60) Provisional application No. 62/280,761, filed on Jan. 20, 2016.

(51) Int. Cl.
*H01L 49/02* (2006.01)

(52) U.S. Cl.
CPC .................................... *H01L 28/10* (2013.01)

(58) Field of Classification Search
USPC ......................................................... 257/531
See application file for complete search history.

(56) References Cited

U.S. PATENT DOCUMENTS

| 8,247,093 | B2 | 8/2012 | Rodmacq et al. | |
|---|---|---|---|---|
| 9,024,415 | B2 | 5/2015 | Zhang et al. | |
| 2014/0093747 | A1* | 4/2014 | Marinero | G11B 5/66 |
| | | | | 428/828.1 |

OTHER PUBLICATIONS

Senini et al., "The Coupled Inductor Filter: Analysis and Design for AC Systems," IEEE Trans. Ind. Electron. vol. 45, pp. 574-578 (Aug. 1998).
Balog et al., "Coupled-Inductor Filter: A Basic Filter Building Block," IEEE Trans. Power Electron. vol. 28, pp. 537-546 pages (Jan. 2013).
Morrow et al., "Design and Fabrication of On-Chip Coupled Inductors Integrated With Magnetic Material for Voltage Regulators," IEEE Trans. Magn. vol. 47, pp. 1678-1686 (Jun. 2011).
Sturcken et al., "A 2.5D Integrated Voltage Regulator Using Coupled-Magnetic-Core Inductors on Silicon Interposer," IEEE J. Solid-State Circuits, vol. 48, pp. 244-254 (Jan. 2013).

(Continued)

*Primary Examiner* — Marcos D Pizarro
*Assistant Examiner* — Lawrence Tynes, Jr.
(74) *Attorney, Agent, or Firm* — Lowenstein Sandler LLP

(57) ABSTRACT

An electrical device includes a current transport layer made of an anomalous Hall material. The electrical device also includes a first ferromagnetic island in physical contact with the current transport layer and a second ferromagnetic island in physical contact with the current transport layer, the second ferromagnetic island oriented with respect to the first ferromagnetic island such as to concentrate a magnetic field, generated by current flow along a conducting surface of the anomalous Hall material, over the first ferromagnetic island and the second ferromagnetic island.

20 Claims, 14 Drawing Sheets

(56) References Cited

OTHER PUBLICATIONS

Wang et al., "Integrated on-chip inductors with electroplated magnetic yokes (invited)," J. Appl. Phys. 111, 07E732, pp. 585-592 (Mar. 13, 2012).

Mathuna et al., "Magnetics on Silicon: An Enabling Technology for Power Supply on Chip," IEEE Trans. Power Electron. vol. 20, 8 pages (May 2005).

Gardner et al., "Review of On-Chip Inductor Structures With Magnetic Films," IEEE Trans. Magri. vol. 45, pp. 4760-5766 (Oct. 2009).

Sarkar et al., "High-Frequency Behavior of Graphene-Based Interconnects—Part II: Impedance Analysis and Implications for Inductor Design," IEEE Trans. Electron Devices, vol. 58, pp. 853-859 (Mar. 2011).

Zhou et al., "Graphene-based Inductors: Fabrication and Performance," ECS Trans. 52, pp. 1027-1032 (Mar. 2013).

Li et al., "Graphene Inductors for High-Frequency Applications—Design, Fabrication, Characterization, and Study of Skin Effect," 2014 IEEE Int. Electron Devices Meet, 4 pages (Dec. 15, 2014).

Li et al., "High-Frequency Analysis of Carbon Nanotube Interconnects and Implications for On-Chip Inductor Design," IEEE Trans. Electron Devices, vol. 56, pp. 2202-2214 (Oct. 2009).

Semiconductor Industry Association, "International Technology Roadmap for Semiconductors 2.0, 2015 Edition, Executive Report," Tech. Rep, 79 pages (2015).

Hasan et al., "Colloquium: Topological insulators," Reviews of Modern Physics, vol. 82, pp. 3045-3067 (Nov. 8, 2010).

Qi et al., "Topological insulators and superconductors," Reviews of Modern Physics, vol. 83, pp. 1057-1110 (Oct.-Dec. 2011).

Cho et al., "Insulating Behavior in Ultrathin Bismuth Selenide Field Effect Transistors," Nano Letters, 2011 American Chemical Society, pp. 1925-1927 (Apr. 12, 2011).

Zhu et al., "Topological Insulator Bi2Se3 Nanowire High Performance Field-Effect Transistors," Scientific Reports, vol. 3, pp. 1-5 (Apr. 30, 2013).

Li et al., "Controlling electron propagation on a topological insulator surface via proximity interactions," Physical Review B 89, pp. 045425-1 through 045425-8 (Jan. 24, 2014).

Zhang et al., "Chiral interconnects based on topological insulators," SPIE vol. 8373, pp. 837309-1 to 837309-11 (May 1, 2012).

Philip et al., "Performance of Topological Insulator Interconnects," IEEE Electron Device Letters vol. 38, No. 1, pp. 138-141 (Jan. 2017).

Wu et al., "Spin and momentum filtering of electrons on the surface of a topological insulator," Applied Physics Letters 98, pp. 162101-1 to 162101-3 (Apr. 2011).

Pesin et al., "Spintronics and pseudospintronics in graphene and topological insulators," Nature Materials, vol. 11, pp. 409-416 (May 2012).

Duan et al., "Spin Logic via Controlled Correlation in a Topological Insulator-Nanomagnet Hybrid Structure," in 71st Device Res. Conf., pp. 133-134 (IEEE, Jun. 2013).

Fu et al., "Superconducting Proximity Effect and Majorana Fermions at the Surface of a Topological Insulator," Physical Review Letters, pp. 096407-1 to 096407-4 (Mar. 6, 2008).

Fu et al., "Topological Insulators in Three Dimensions," Physical Review Letters, 98, pp. 106803-1 to 106803-4, pp. 438-442 (Mar. 9, 2007).

Zhang et al., "Topological insulators in Bi2Se3, Bi2Te3 and Sb2Te3 with a single Dirac cone on the surface," Nature Physics, vol. 5, pp. 438-442 (May 10, 2009).

Chen et al., "Experimental Realization of a Three-Dimensional Topological Insulator, Bi2Te3," Science, vol. 325, pp. 178-181 (Jul. 10, 2009).

Nagaosa et al., "Anomalous Hall effect," Reviews of Modern Physics, vol. 82, pp. 1539-1592 (Jun. 2010).

Haldane et al., "Berry Curvature on the Fermi Surface: Anomalous Hall Effect as a Topological Fermi-Liquid Property," Physical Review Letters, vol. 93, pp. 206602-1 to 206602-4 (Nov. 12, 2004).

Haldane et al., "Model for a Quantum Hall EFfect without Landau Levels: Condensed-Matter Realization of the 'Parity Anolmaly'," Physical Review Letters, pp. 2015-2018 (Oct. 31, 1988).

Liu et al., "Quantum Anomalous Hall Effect in Hg1-yMnyTe Quantum Wells," Physical Reivew Letters, 101, pp. 146802-1 to 146802-4 (Oct. 3, 2008).

Yu et al., "Quantized Anomalous Hall Effect in Magnetic Topological Insulators," Science, vol. 329, pp. 61-64 (Jul. 2, 2010).

Chang et al., "Experimental Observation of the Quantum Anomalous Hall Effect in a Magnetic Topological Insulator," Science, vol. 340, pp. 167-170 (Apr. 12, 2013).

Roushan et al., "Topological surface states protected from backscattering by chiral spin texture," Nature, vol. 460, pp. 1106-1110 (Aug. 27, 2009).

Xu et al., "Massive Dirac Fermion on the Surface of a Magnetically Doped Topological Insulator," Science, vol. 8, pp. 659-662 (Aug. 6, 2012).

Xu et al., "Hedgehog spin texture and Berry's phase tuning in a magnetic topological insulator," Nature Physics, vol. 8, pp. 616-622 (Aug. 2012).

Wei et al., "Current conserving nonequilibrium AC transport theory," Physical Review B 79, pp. 195315-1 to 195315-8 (May 15, 2009).

Shevtsov, et al., "Numerical toolkit for electronic quantum transport at finite frequency," Physical Review B 87, pp. 085304-1 to 085304-17 (Feb. 13, 2013).

Zhang et al., "Gauge-invariant and current-continuous microscopic AC quantum transport theory," The European Physical Journal B, 86:423, pp. 2-5 (Oct. 9, 2013).

Luebbers et al., "A Frequency-Dependent Finite-Difference Time-Domain Formulation for Dispersive Materials," IEEE Trans. Electromagn. Compat. vol. 32, No. 3, pp. 222-227 (Aug. 1990).

Wagner et al., "Divergent Fields, Charge, and Capacitance in FDTD Simulations," IEEE Transactions on Microwave Theory and Techniques vol. 46, No. 12, pp. 2131-2136 (Dec. 1998).

Smit, The Spontaneous Hall Effect in Ferromagnetics II, Physica 24, pp. 39-51 (1958).

Vignale, "Ten Years of Spin Hall Effect," J. Supercond. Nov. Magn. 23:3-10, pp. 1-10 (Oct. 1, 2009).

Yang et al., "Quantum Hall effects in a Weyl semimetal: Possible application in pyrochlore iridates," Physical Review B 84, pp. 075129-1 to 075129-11 (Aug. 9, 2011).

Burkov, "Anomalous Hall Effect in Weyl Metals," Physical Review Letters 113, pp. 187202-1 to 187202-5 (Oct. 31, 2014).

Zyuzin et al., "Intrinsic Anomalous Hall Effect in Type-II Weyl Semimetals," ISSN 0021-3640, JETP Letters, 2016, vol. 103, No. 11, pp. 717-722 (Apr. 27, 2016).

Bruno, et al., "Topological Hall Effect and Berry Phase in Magnetic Nanostructures," The American Physical Society, Physical Review Letters, vol. 96, No. 9, pp. 096806-1 to 096806-4 (Aug. 27, 2004).

Oveshnikov et al., "Berry phase mechanism of the anomalous Hall effect in a disordered two-dimensional magnetic semiconductor structure," Scientific Reports, pp. 1-9 (Nov. 24, 2015).

Lake et al., "Single and multiband modeling of quantum electron transport through layered semiconductor devices," Journal of Applied Physics, vol. 81, No. 12, pp. 7845-7869 (Jun. 15, 1997).

Anantram et al., "Modeling of Nanoscale Devices," Proceedings of the IEEE, vol. 96, No. 9, pp. 1511-1550 (Sep. 2008).

Chew et al., "Vector Potential Electromagnetics with Generalized Gauge for Inhomogeneous Media: Formulation," Progress in Electromagnetics Research, vol. 149, pp. 69-84 (Sep. 2, 2014).

Yee, "Numerical Solution of Initial Boundary Value Problems Involving Maxwell's Equations in Isotropic Media," IEEE Transactions on Antennas and Propagation, pp. 302-307 (May 1996).

Piemas, et al. "High-Q Factor Three-Dimensional Inductors", Microwave Theory and Techniques, IEEE Transactions, vol. 50, No. 8, pp. 1942-1949, Aug. 2002.

Qi et al., "The Quantum Spin Hall Effect and Topological Insulators," Physics Today 63.1, pp. 33-38, Jan. 2010.

Felser et al., "Topological Insulators," MRS Bulletin 39.10, pp. 843-846, Oct. 2014.

(56) References Cited

OTHER PUBLICATIONS

Huynen et al., "Integrated Microwave Inductors on Silicon-on-Insulator Substrate," Microwave Conference, 1997, 27th European, vol. 2. IEEE, pp. 1008-1013, 1997.
Khalid et al., "A Very High Q-Factor Inductor using MEMS Technology," SPIE Smart Structures and Materials+ Nondestructive Evaluation and Health Monitoring, International Society for Optics and Photonics, vol. 7646 76461I-1, 12 pages, 2010.
Steinhogl et al., "Size-Dependent Resistivity of Metallic Wires in the Mesoscopic Range," Physical Review B, vol. 66, No. 7, published Aug. 23, 2002, pp. 075414-1 to 075414-4.
C. Wang et al., "Carbon Nanotube Electronics-Moving Forward," Chemical Society Reviews, vol. 42, No. 7, pp. 2592-2609, 2013.
Mahfouzi et al., "Microwave-Driven Ferromagnet-Topological-Insulator Heterostructures: The Prospect for Giant Spin Battery Effect and Quantized Charge Pump Devices," Physical Review B, vol. 82, No. 19, 7 pages, May 20, 2010.

\* cited by examiner

M = 0      M > 0      M < 0

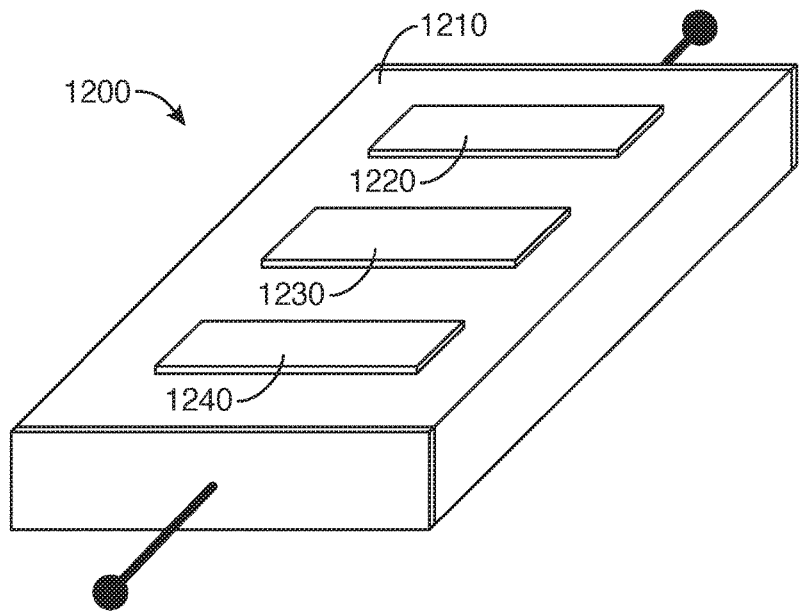
FIG. 12
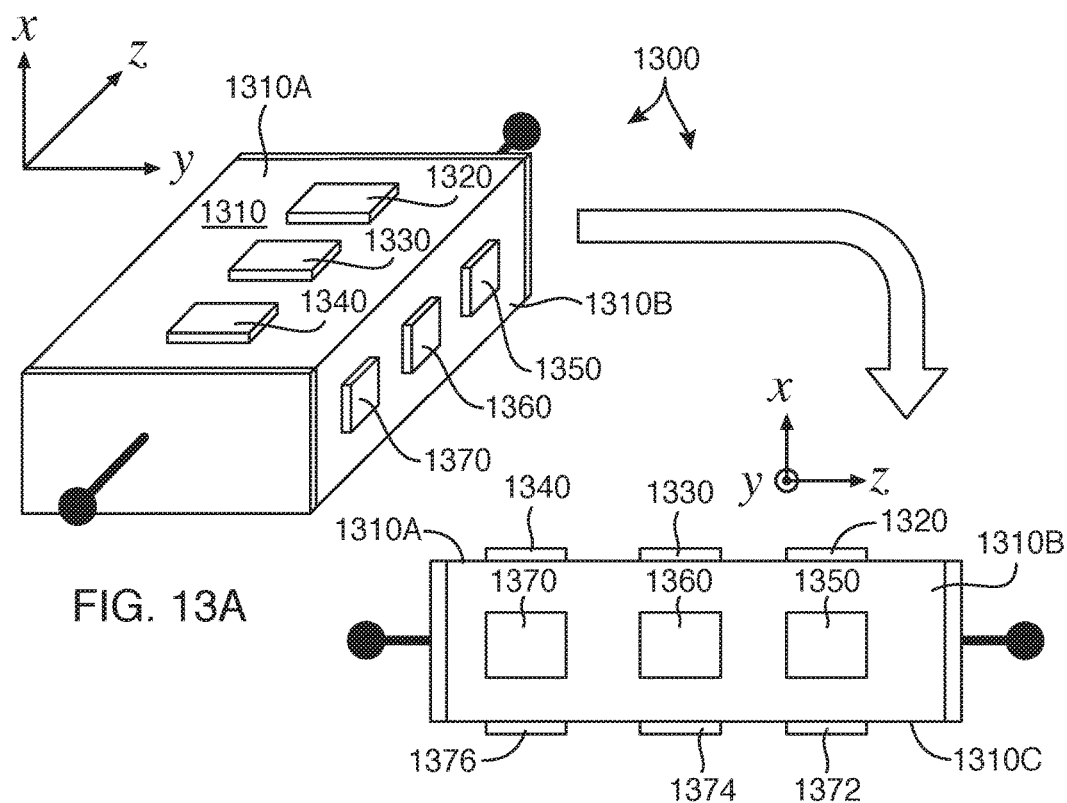
FIG. 13A
FIG. 13B

NANOSCALE HIGH-PERFORMANCE TOPOLOGICAL INDUCTOR

REFERENCE TO EARLIER FILED APPLICATION

This application claims the benefit under 35 U.S.C. §119 (e) of U.S. Provisional Patent Application No. 62/280,761, filed Jan. 20, 2016, which is incorporated herein, in its entirety, by this reference.

FEDERALLY SPONSORED RESEARCH OR DEVELOPMENT

This invention was made with government support under N0014-11-1-0123 awarded by the Office of Naval Research and under EECS-1351871 awarded by the National Science Foundation. The government has certain rights in the invention.

BACKGROUND

On-chip inductors are integral, passive circuit components that convert electrical current into magnetic energy for use in a variety of analog filter and voltage regulator circuits. More specifically, inductors convert any change in current into magnetic flux that, in turn, induces a voltage across the inductor. Inductors thus offer an ability to resist sudden changes in current and are widely used in applications as diverse as power substations to filters for radio frequency (RF) circuits and DC-DC power converters.

Because of the demands of planar fabrication processes, on-chip inductors may be spiraled metallic wire traces, typically copper, on the surface of a semi-conductor substrate that link the magnetic flux generated by the concentric coils to concentrate magnetic energy. Although the spiral geometry maximizes flux linkage for a two-dimensional system, limitations in fabricating highly-conducting, closely-spaced spiraled traces results in the consumption of a large chip area to create inductors of significant inductance. The complicated geometries of inductors have inhibited their ability to scale with other components of the on-chip circuits, and thus have become the limiting component in the down-scaling of some RF integrated circuits.

BRIEF DESCRIPTION OF THE DRAWINGS

A more particular description of the disclosure briefly described above will be rendered by reference to the appended drawings. Understanding that these drawings only provide information concerning typical embodiments and are not therefore to be considered limiting of its scope, the disclosure will be described and explained with additional specificity and detail through the use of the accompanying drawings.

FIG. 12 is a perspective view of a topological inductor having oblong-shaped ferromagnetic islands on a current transport layer, according to an embodiment of the present disclosure.

FIG. 13A is a perspective view of a topological inductor having ferromagnetic islands placed on both the top and sides of a current transport layer, according to an embodiment of the present disclosure.

FIG. 13B is a perspective view of a topological inductor having ferromagnetic islands placed on the top, bottom and sides of a current transport layer, according to an embodiment of the present disclosure.

DETAILED DESCRIPTION

Figures 1A, 1B, 1C:
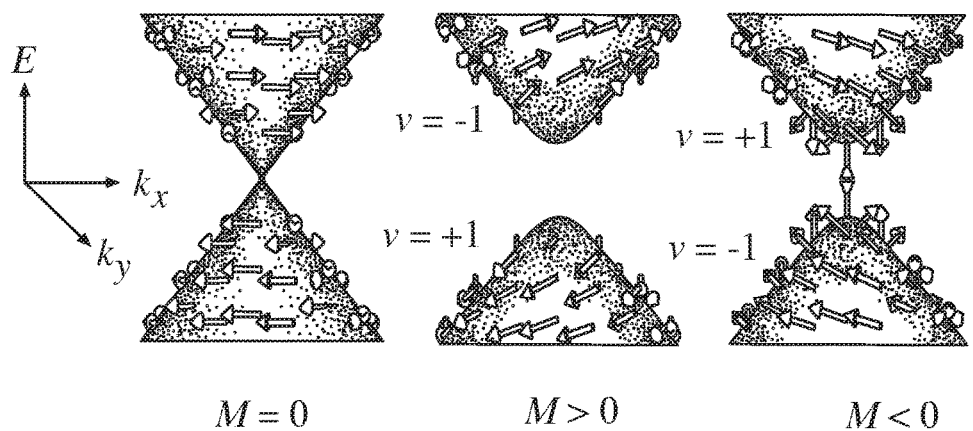
FIG. 1A is a diagram of surface states of an anomalous Hall material with zero magnetization (M=0) according to an embodiment of the present disclosure.
FIG. 1B is a diagram of surface states of an anomalous Hall material when magnetization is added through a Zeeman interaction (M>0), according to an embodiment of the present disclosure.
FIG. 1C is a diagram of surface states of an anomalous Hall material when the sign of the magnetization added in FIG. 1B is flipped according to an embodiment of the present disclosure.

By way of introduction, the present disclosure relates to an electrical device that functions as an inductor at nanometer scale, yet provides a significant inductance, thus removing the inductor as being the limiting component in the down-scaling of RF integrated circuits. In one embodiment, the inductor includes a current transport layer made of an anomalous Hall material (AHM), which is a conductor with an electronic band structure that, in the presence of an inversion symmetry breaking perturbation and/or time reversal symmetry breaking perturbation, is topologically nontrivial with a non-zero Chern number of the occupied bands. The inductor further includes a first ferromagnetic island in physical contact with the current transport layer and at least a second ferromagnetic island in physical contact with the current transport layer, the second ferromagnetic island oriented with respect to the first ferromagnetic island such as to concentrate a magnetic field, generated by current flow along a conducting surface of the anomalous Hall material, over the first ferromagnetic island and the second ferromagnetic island. The concentration of magnetic flux forms an inductor on a chip or within a small-scale electrical device, including nanoscale device dimensions. The electrical device that functions as an inductor, according to the various embodiments disclosed herein, by be incorporated into a radio frequency filter, a radio frequency amplifier, an electrical transformer or other such devices of systems.

The disclosed inductor design exploits materials that are inherently Chern insulators, become Chern insulators, or host an anomalous or quantum anomalous Hall effect under some appropriate perturbation to the material. A Chern insulator is an insulator with broken time-reversal symmetry and containing occupied bands with non-zero Chern number, making them topologically nontrivial. Time-reversal symmetry is exhibited in a material when an electron with spin up (+k) can be mapped onto a spin down (−k), exhibiting degeneracy between these two spin/momentum states at time-reversal invariant points within the Brillouin zone of the material. Chern insulators exhibit a current-carrying edge state that lies within the bulk band gap. A trivial insulator, in contrast, is an ordinary insulator having a band gap and no states within this gap.

In the present description, the term "anomalous Hall material" (or AHM) is used to refer collectively to a group of materials that can host an anomalous Hall effect (AHE) or a quantum anomalous Hall effect (QAHE), including but not limited to: topological insulators, variations or variants of topological insulators (TIs), topological magnetic insulators, quantum anomalous Hall (QAH) insulators, which are bulk insulating materials possessing a quantum anomalous Hall effect, Chern insulators, Weyl semi-metals, magnetic semiconductors, and topological crystalline insulators. In general, a topological insulator is a material that has gapped bulk, but conducting edge or surface states that are protected by the presence of some symmetry. The surface or edge state of a topological insulator is gapless and cannot be gapped by perturbations that preserve the underlying symmetry, and thus protects the surface or edge state, e.g. they are "topologically protected." Specifically, Weyl semi-metals are topological materials in which the electronic bands disperse linearly around pairs of nodes with each possessing a fixed chirality, the Weyl points. Magnetic semiconductors are semiconductor materials that exhibit both ferromagnetism (or a similar response) and useful semiconductor properties. These are based on traditional semiconductors, but are doped with transition metals instead of, or in addition to, electronically active elements. Topological crystalline insulators are bulk insulators in which the topological nature of electronic structures arises from the presence of crystal symmetries.

Anomalous Hall materials use an electronic band structure that, in the presence of an inversion symmetry and/or time-reversal symmetry that breaks perturbation host an AHE or QAHE and often possess topologically nontrivial bands with a nonzero Chern number. These bands are typically made nontrivial through strong spin-orbit coupling. Anomalous Hall materials include, but are not limited to: HgTe (mercury telluride), (Hg,Cd)Te, (In, Mn)As, (Ga, Mn)As, graphene, two-dimensional transition metal di-chalcogenides with 1T' structure, namely, 1T'-$MX_2$ with M=(tungsten or molybdenum) and X=(tellurium, selenium, or sulfur), $Bi_2Se_3$, $Bi_2Te_3$, $Sb_2Te_3$, Cr- and V-doped $(Bi,Sb)_2Te_3$, SnTe, $Pb_xSn_{1-x}Te$, $HgCr_2Se_4$, and TaAs. In one embodiment, $Bi_2Se_3$ is used as the AHM. Other topological insulators, even those yet to be discovered, known to a person having ordinary skill in the art, may be used without deviating from the present disclosure.

The AHE and the QAHE are characterized by the generation of a transverse current, called a Hall current, in the direction that is perpendicular to an applied electric field. These effects are distinct from the traditional Hall effect, as well as both the integer and the fractional quantum Hall effects, in that no external magnetic field is necessary for the transverse current, quantized or not, to be observed. Both effects are characteristic of a material with strong spin-orbit interaction that allows for the energy bands to have a non-zero Chern number. The QAHE is found in Chern insulator systems when the chemical potential lies in an energy gap above a filled band of non-zero Chern number. In this scenario, the transverse current is found to be quantized in integer multiples of $e^2/h$, where e is the electron charge and h is Planck's constant. The AHE is observed in metallic or semiconducting materials when the chemical potential crosses an energy band with non-zero Berry curvature, a momentum-space equivalent of a magnetic field.

There is no requirement for this Hall conductivity to be quantized, but typically it is enhanced by additional quantum mechanical processes such as skew scattering and side-jump scattering.

The topological invariant of a Chern insulator is the edge state and the Chern number gives the number of edge states that propagate. Thus, a nontrivial Chern insulator has edge states. The edge states of a Chern insulator are chiral, meaning that in one channel the electrons only propagate one direction, and in another other channel, the electrons propagate in the opposite direction. This is similar to the integer quantum Hall effect (IQHE), which also has chiral edge states. Accordingly, a Chern insulator may be viewed as a lattice version of the IQHE that does not require a strong magnetic field, which results in the QAHE when the chemical potential of the material lies within the band gap created by the magnetization. A Chern insulator may go from the trivial phase to the topological phase by changing parameters in the lattice model such as on-site or by hopping energy.

In one embodiment, therefore, a topological inductor device is disclosed that uses the coupling between topologically nontrivial materials and ferromagnetic materials. The various inductors disclosed herein are useful in a variety of applications. For example, inductors are useful in small-scale electronic devices where traditional inductors consume too much space. The disclosed topological inductor overcomes limitations of the prior methods by taking advantage of newly understood physical responses of materials that exhibit the QAHE or the AHE, which greatly enhances the quality factor (Q), which is the ratio of the energy stored in the magnetic field to the energy lost to the intrinsic resistance of the material, and represents a standard inductor performance metric. In addition to the enhancement in Q, the disclosed topological inductor design simultaneously reduces the lithographically-defined device footprint. The high performance and small size provide enhanced scalability pathways, thereby promising to be a vital component for future nanoscale circuit designs, and even some slightly larger designs as well.

In the present description, the term spin-orbit coupling may also be called spin-orbit interaction or the spin-orbit effect. Spin-orbit interaction is an energetic coupling between an electron's orbital motion and its intrinsic spin. Such coupling dictates that electrons' orbital occupation and spin are no longer independent degrees of freedom, as in most ordinary materials. The result of this interaction is a shift in the electronic orbital energy spectrum that can lead to the development of non-zero Chern number bands. Materials having strong spin-orbit interaction may come in semiconductor, metallic, or insulator forms.

An inductor is a passive electrical component that resists changes in electric current passing through it. The inductor usually includes a conductor such as a wire, usually wound into a coil. When a current flows through the wire, energy is stored temporarily in a magnetic field in the coil. When the current flowing through an inductor changes, the time-varying magnetic field induces a voltage in the conductor, according to Faraday's law of electromagnetic induction. According to Lenz's law, the direction of induced electromagnetic field is always such that it opposes the change in current that created it. As a result, inductors always oppose a change in current. Inductance (L) results from the magnetic field around a current-carrying conductor. The inductance, L, may be defined as $L=2E_B/I^2$, where I is the current flowing through the system and $E_B$ is the magnetic field energy. $E_B$ is computed from the magnetic field as $E_B=\int B \cdot B/\mu \, dV$ where the integral is computed over the device active region. B is the magnetic field and $\mu$ is the magnetic permeability of a material. The spin-orbit interaction will be more fully understood upon consideration of the following non-limiting example, which is offered for purposes of illustration, not limitation.

The surface of a three-dimensional time-reversal-invariant (TRI) topological insulator (TI) has electronic surface states that have a Dirac-like linear energy-momentum (E-k) dispersion relationship that does not have the energy gap associated with it, unlike common semiconductors like silicon. In TRI topological insulators, the spin-orbit interaction is strong enough that the TRI topologic insulator inverts one or more of the atomic orbital bands in energy, resulting in a Dirac mass (or negative Einstein mass, which is the mass in Dirac's equation) for the material. Therefore, as the vacuum has a positive Einstein mass, at the surface the value of the Einstein mass switches from negative to positive, thereby trapping a gapless two-dimensional (2D) surface state. This gapless energy band structure has very interesting physical properties due to the presence of the time-reversal invariance in the system. Three-dimensional (3D) TRI topological insulators have quasi-particle transport that is protected from backscattering by non-magnetic impurities because of the strong spin-orbit interaction that locks the spin of the quasiparticles to their respective momenta, which are properties that have been experimentally observed. When magnetic impurities, with an associated magnetization orientation perpendicular to the surface of the TI, are deposited on the surface, the dispersion becomes gapped and this creates a region in energy-momentum space where the electrons may not reside.

FIGS. 1A through 1D includes an illustration of this process using the energy-momentum dispersion relationship, where E stands for energy, k stands for momentum, M stands for a magnetically-induced Zeeman energy (or more generally, a magnetic field or simply "magnetization"), v stands for the Chern number, and the cone-like structures represent the band structure of the AHM. FIG. 1A is a diagram of surface states of an anomalous Hall material (such as a topological insulator, as one example) with zero magnetic field (M=0) and the characteristic spin-momentum locking indicated by the superimposed arrows. Comparing FIG. 1A with FIGS. 1B and 1C, note that the band structure changes when magnetism with magnitude, M (typically referred to as either the Dirac or Einstein mass within the context of the Dirac equation), is incorporated onto the surface of the TI. The nontrivial topology of the AHM band structure results in a non-zero Chern number, v, of the energy in which the sign of the respective bands are determined by the sign of M, as seen in FIG. 1B (for M>0) and FIG. 1C (for M<0).

More specifically, and by way of example, the surface states of a 3D TRI topological insulators are Dirac electrons characterized by the low-energy energy-momentum dispersion $$E_{surf}=\sqrt{\hbar^2 v_F^2 |k|^2 + M^2}, \quad (1)$$

where $\hbar$ is the reduced Planck's constant, $v_F$ is the electron's Fermi velocity, k is the electron's momentum, and M is a magnetically-induced Zeeman energy, as mentioned. FIG. 1A illustrates linear dispersion in the absence of ferromagnetism when M=0 and $E_{surf}=\hbar v_F |k|$. This linear dispersion combined with the fact that spin, illustrated by the superimposed arrows in FIG. 1A, is locked to momentum and results in highly conductive surfaces with suppressed backscattering.

With further reference to FIGS. 1B and 1C, when a perpendicularly-oriented ferromagnet is placed in proximity to the surface, M≠0, and a gap opens in the dispersion that divides the surface states into topologically nontrivial 2D bands characterized by the indicated Chern number. When the magnetization orientation is away from the bulk (FIG. 1B), M is positive, resulting in the lower occupied band having a Chern number of +1. In contrast, when the magnetization orientation is towards the bulk (FIG. 1C), M is negative, resulting in the lower occupied band having a Chern number of −1.

Figure 1D:
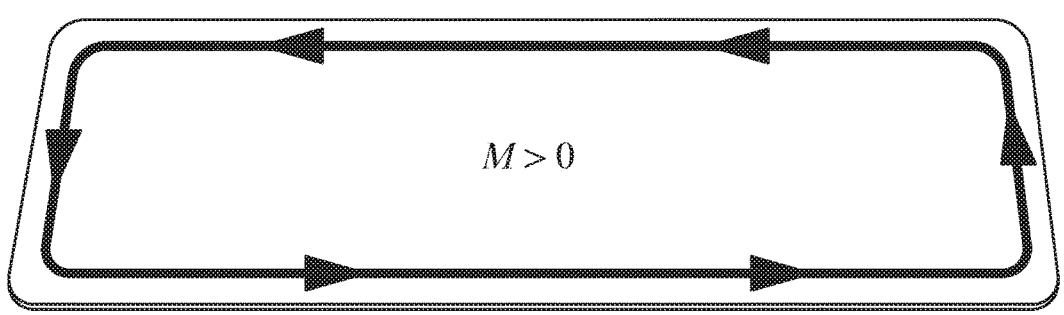
FIG. 1D is a diagram indicating a direction of current flow of an edge state due to the positive magnetization applied as in FIG. 1B, according to an embodiment of the present disclosure.

This nontrivial topology manifests at interfaces as a chiral, one-dimensional edge state as shown in FIG. 1D, the direction of which can be switched by changing the sign of the magnetization. When an electric field is applied in these topological systems while the chemical potential lies within the magnetic gap, a QAHE is observed in which a quantized current flows via the edge mode perpendicular to the field with conductivity given by $\sigma_{xy} = v_{occ} \cdot e^2/h$, where $v_{occ}$ is the sum of the Chern numbers of all occupied bands, e is the electron charge, and h is Planck's constant. This unique Hall response may be used to control the direction of the surface current density by using different magnetization orientations, to thus create a high-performance nanoscale inductor. This magnetization is a result of the interplay between the ferromagnetic domains and the surface of the material, which possesses a non-zero Chern number. In this case, a chiral edge states develop on the surface of the topological material when the chemical potential lies within the magnetic band gap. If the magnetization has an opposite sign, the resultant edge state propagates in the opposite direction, providing a highly controllable channel for current guidance.

Figure 2:
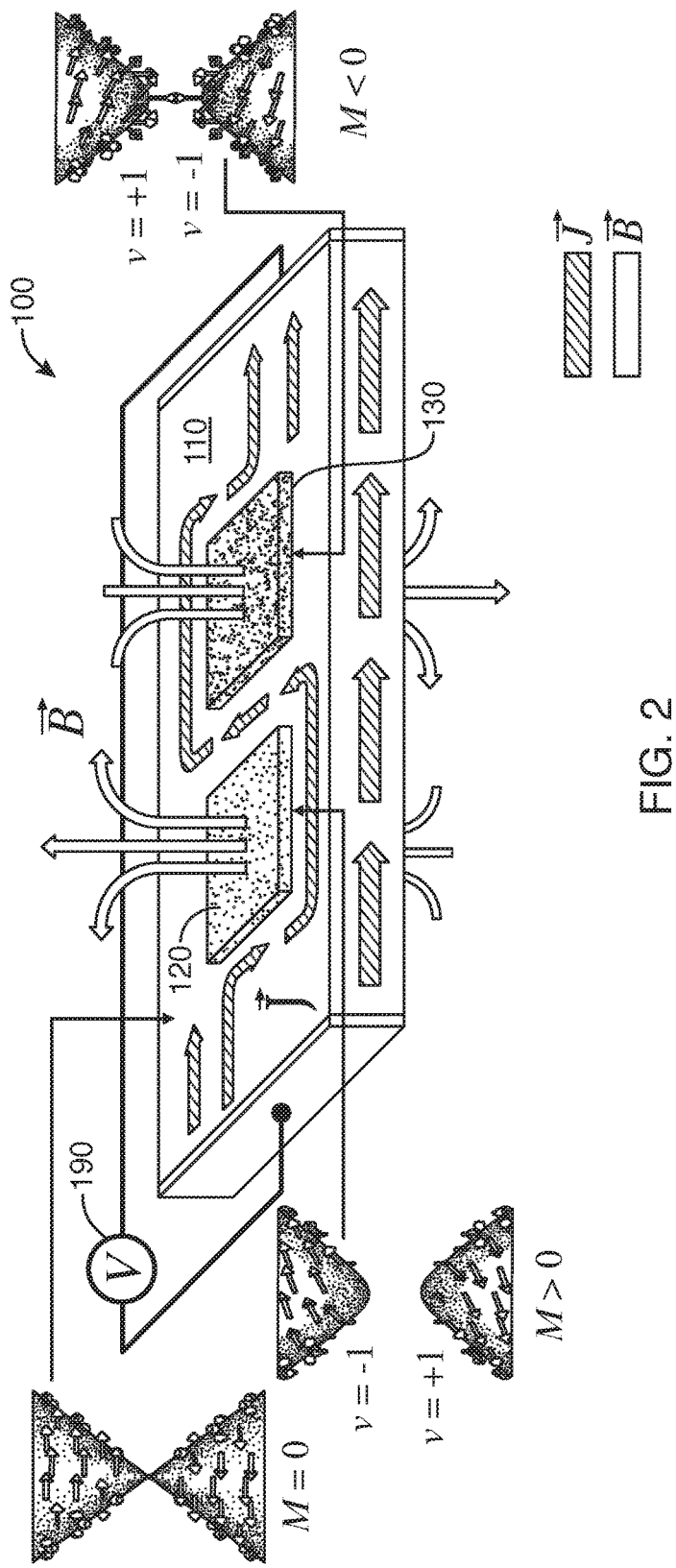
FIG. 2 is a functional diagram of a topological inductor, according to an embodiment of the present disclosure.

FIG. 2 illustrates a schematic of the topological inductor 100, according to an embodiment of the present disclosure. In one embodiment, the topological inductor 100 includes a current transport layer 110 (made of an anomalous Hall material (AHM)), a pair of ferromagnetic islands 120 and 130, and a voltage source 190 connected to either end of the current transport layer 110. In one embodiment, the voltage source 190 may be a two terminal device, which can maintain a fixed voltage. Examples of a voltage source include, but are not limited to, batteries, generators, and power systems. In operation, the voltage source 190 provides electrical current to the system.

A ferromagnetic island (or "FI") is a deposit of ferromagnetic material formed on the surface of the current transport surface of an anomalous Hall material that creates a magnetic field in the surrounding area. The ferromagnetic islands may be formed using any of the materials that form a magnetic field or a combination of materials that form a magnetic field. Ferromagnetic materials include, but are not limited to: Co, Fe, $Fe_2O_3$, $FeOFe_2O_3$, $NiOFe_2O_3$, $CuOFe_2O_3$, $MgOFe_2O_3$, MnBi, Ni, MnSb, $MnOFe_2O_3$, $Y_3Fe_5O_{12}$, $CrO_2$, MnAs, Gd, Dy, and EuO. In one embodiment, the first ferromagnetic islands (FI) 120 has the upward magnetization (away from the bulk) and the second FI 130 has a downward magnetization (towards the bulk), which are placed on the surface of the AHM to selectively create magnetic band gaps in the surface state dispersion.

With further reference to FIG. 2, when the chemical potential is within the magnetic gap in the surface states and a bias voltage (V) 190 is applied, the current density $\vec{J}$ is steered counterclockwise by the QAHE through the chiral edge current around the perimeter of the first FI 120 where M>0 and $v_{occ}=+1$. The subsequent FI 130 with M<0 and $v_{occ}=-1$ hosts a chiral edge current that propagates in the opposite (clockwise) direction causing the current density to flow between the ferromagnetic islands perpendicular to the applied bias and circle around the FI 130. By directing the current density around the FIs 120 and 130, the current-generated magnetic field $(\vec{B})$ is concentrated and linked through the FIs, resulting in the storage of magnetic energy. Further flux linkages are made by magnetic fields between adjacent FIs, amplifying the magnetic energy within the device. Since the inductance (L) can be related to the magnetic energy $E_B$ by the expression $L=2E_B/I^2$, where I is the current through the device, this pattern of FIs on the surface of an AHM results in a highly inductive circuit component.

The first ferromagnetic island 120 and the second ferromagnetic island 130 may be deposited on the surface of the current transport layer 110 in any conventional or unconventional methods, including, but not limited to, liquid phase epitaxy, sputtering, laser ablation, chemical vapor deposition, and reactive evaporation. In one embodiment, the current transport layer 110 is less than 3.5 nm in the x direction, less than 3.5 nm in the y direction, less than 3 nm in the z direction. (See FIGS. 1A-1C.) The size of the current transport layer 110 may be modified without deviating from the principles of the present disclosure.

In an alternative embodiment, the first ferromagnetic island 120 has a magnetization in positive z direction with a magnitude $M_1$, as illustrated in FIG. 2. The magnetization of the first ferromagnetic island, therefore, can be expressed as $+M_1$ (alternatively can also be expressed as $-M_2$). The second ferromagnetic island 130 has a magnetization in negative z direction with a magnitude $M_2$. The magnetization of the second ferromagnetic island therefore can be expressed as $-M_2$. This alternatively can be expressed as $+M_1$, with the first ferromagnetic island expressed as $-M_2$. In operation, when the current density encounters the first ferromagnetic island 120 with magnetization $+M_1$, the current is deflected to the −y direction by the QAHE after which it continues in the positive x direction. When the current density encounters the second ferromagnetic island 130 with magnetization $-M_2$, the current is deflected to the +y direction by the QAHE after which it continues in the positive x direction.

In an alternative embodiment, in operation, the voltage source 190 applies an electric field across the current transport layer 1310 in the −x direction through the application of a voltage, V. Then the current density begins to flow on the surface of the current transport layer 110 as electrons are transported through the surfaces states.

In an alternative embodiment, the direction of the magnetization of the first ferromagnetic island 120 and second ferromagnetic island 130 may be reversed. In yet another embodiment, the magnitude $M_1$ of the first ferromagnetic island 120 is substantially the same as the magnitude $M_2$ of the second ferromagnetic island 130. In another embodiment, the magnitude $M_1$ of the first ferromagnetic island 120 is greater than the magnitude $M_2$ of the second ferromagnetic island 130. In an alternative embodiment, the magnitude $M_1$ of the first ferromagnetic island 120 is less than the magnitude $M_2$ of the second ferromagnetic island 130. In an alternative embodiment, the magnitude $M_1$ of the second ferromagnetic island 130 is less than the magnitude $M_2$ of the first ferromagnetic island 120. In an alternative embodiment, the magnitude $M_1$ of the second ferromagnetic island 130 is at least half of the magnitude $M_2$ of the first ferromagnetic island 120 and no more than two times the magnitude $M_2$ of the first ferromagnetic island 120. However, as long as the anomalous Hall effect is created, the magnetization magnitudes and their relation to one another are not relevant. The magnetization simply converts the AHM material into a Chern insulator. Once it is a Chern insulator, the transport properties are relatively independent of the actual value of magnetization. This insensitivity to the choice of parameters is a hallmark characteristic of topological materials.

In further embodiments, the lengths of the ferromagnetic islands in the y direction can vary to acquire the desired current density distribution. The lengths of the ferromagnetic islands have no real upper limit. In an alternative embodiment, the length of the first ferromagnetic island 120 in the y dimension is substantially the same as the length of the second ferromagnetic island 130 in the y dimension. In an alternative embodiment, the first ferromagnetic island 120 and the second ferromagnetic island 130 are on the same line along the x axis. In alternative embodiments, the first ferromagnetic island 120 and the second ferromagnetic island 130 may have sizes and magnetization different than one another without deviating from the intents of the present disclosure.

In an alternative embodiment, the distance between the edge of the first ferromagnetic island 120 closest to the second ferromagnetic island 130 and the edge of the second ferromagnetic island 130 closest to the first ferromagnetic island 120 can be any distance. This distance may be increased or decreased to modify the magnetic field $\vec{B}$ and subsequently the inductance according to the principles described above in relation to the operation of inductors. For applications requiring small footprint device, the distance between first and second ferromagnetic islands may be zero, which may mean only a single bound state at the crossing interface of the two ferromagnetic islands and also that the magnetic field created may be smaller. The magnitudes of the magnetization or Zeeman energy, however, have no upper limit. This will vary depending on the substrate of the current transport layer.

Topological inductors can be used in circuits just as traditional inductor. When formed, the topological inductor will have a negative terminal and a positive terminal. The charge of the terminals may depend on the connection of the voltage source to the particular topological inductor. Therefore, reversing the direction of the current may also reverse the topological inductor's charges on its terminals.

In one embodiment, the voltage source 190 is less than 50 mV. In a further embodiment, the voltage source 190 is the sum of the voltage applied and the chemical potential is less than the magnetization strengths $M_1$ and $M_2$ to use the QAHE and avoid transport through the bulk states in the magnetic regions. In an embodiment, the distance from the first ferromagnetic island 120 to the edge of the current transport layer 110 (which direction is parallel to y axis) is different than the distance of the second ferromagnetic island 130 to the edge of the current transport layer 110 (which direction is also parallel to y axis). There is no maximum limit on the distance of the islands.

Figure 3:
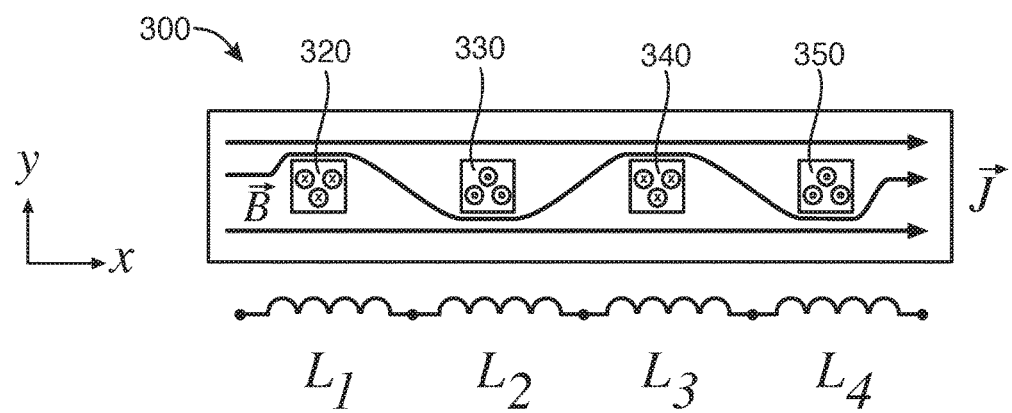
FIG. 3 is a diagram of a set of topological inductors connected in series to increase the inductance of an on-chip topological inductor according to an embodiment of the present disclosure.

FIG. 3 is a diagram of a set of topological inductors 100 connected in series (e.g., a series-connected topological inductor 300) to increase the inductance of an on-chip topological inductor according to an embodiment of the present disclosure. For example, the series-connected topological inductor 300 may include a first ferromagnetic island 320, a second ferromagnetic island 330, a third ferromagnetic island 340, and a fourth ferromagnetic island 350 to produce topological inductances $L_1$, $L_2$, $L_3$, and $L_4$, respectively. The magnetic field, $\vec{B}$, may be generated into the page for $L_1$ and $L_3$, and out of the page for $L_2$ and $L_4$, although the opposite could be true in another embodiment with reversed magnetization of the FI's.

Accordingly, a plurality of topological inductors 100 or 300 may be arranged to form a series circuit. A topological inductor is said to form a series circuit when the positive terminal of a first topological inductor is electronically connected to a negative terminal of a second topological inductor. In an alternative embodiment, a plurality of topological inductors 100 may be arranged to form a parallel circuit, which may be by design to reduce inductance. A topological inductor is said to form a parallel circuit when the positive terminal of a first topological inductor is electronically connected to the positive terminal of a second topological inductor, and the negative terminal of the first topological inductor is electronically connected to the negative terminal of the second topological inductor.

Figure 4:
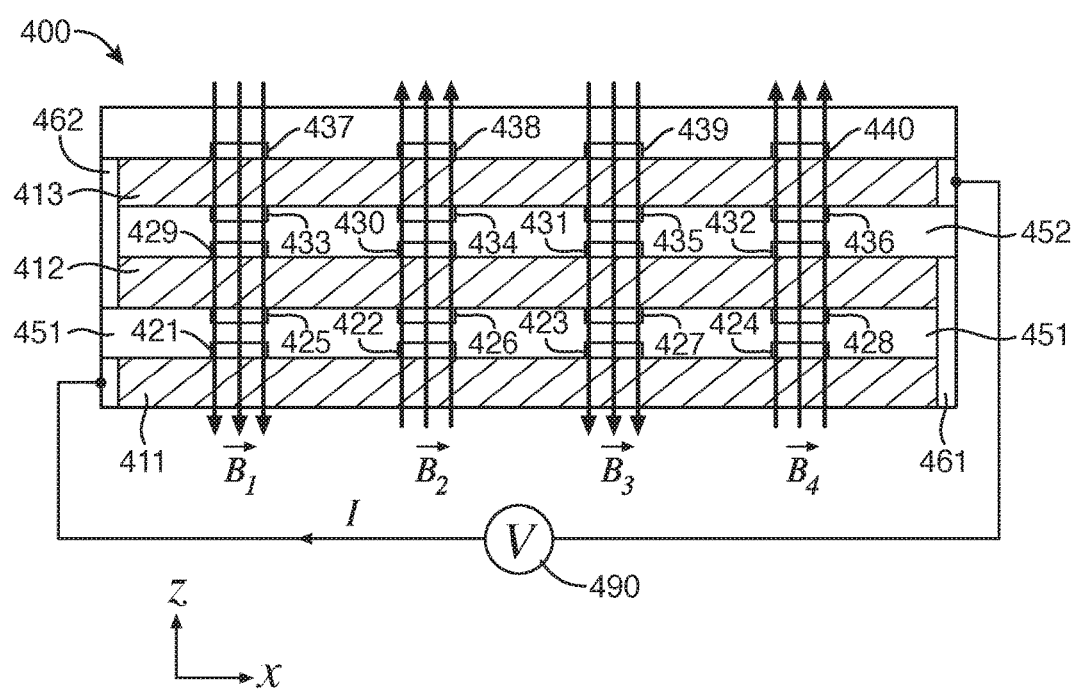
FIG. 4 is a diagram of a multi-layered set of topological inductors connected in series to increase flux linkages between the series topological inductors according to an embodiment of the present disclosure.

FIG. 4 is a diagram of a multi-layered set of topological inductors 400 connected in series to increase flux linkages between the series topological inductors according to an embodiment of the present disclosure. The disclosed topological inductors may be stacked in various combinations to produce the inductance. There is no theoretical limit to the number of topological inductors that can be stacked to achieve a desired inductance. Note that, similar to FIG. 3, the magnetic field, $\vec{B}$, may alternate in direction from series inductor to series inductor where the magnetization of the group flux-linked ferromagnetic islands (FI's) alternates as well.

The stacked topological inductor 400 includes a first current transport layer 411, a second current transport layer 412, a third current transport layer 413, a first ferromagnetic island (FI) 421, a second FI 422, a third FI 423, a fourth FI 424, a fifth FI 425, a sixth FI 426, a seventh FI 427, an eight FI 428, a ninth FI 429, a tenth FI 430, an eleventh FI 431, a twelfth FI 432, a thirteenth FI 433, a fourteenth FI 434, a fifteenth FI 435, a sixteenth FI 436, a seventeenth FI 437, an eighteenth FI 438, a nineteenth FI 439, a twentieth FI 440, a voltage source 490, a first trivial insulator 451, a second trivial insulator 452, a first contact plate 461, and a second contact plate 462.

In the stacked topological inductor 400, the voltage source 490 is in electrical contact with the first current transport layer 411 and the current transport layer 413. The first current transport layer 411 is in electrical contact with the second current transport layer 412 through the first contact plate 461. The second current transport layer 412 is in electrical contact with the third current transport layer 413 through the second contact plate 462. The first current transport layer 411 is in physical contact with the first FI 421, the second FI 422, the third FI 423, and the fourth FI 424. The second current transport layer 412 is in physical contact with the fifth FI 425, the sixth FI 426, the seventh FI 427, the eighth FI 428, the ninth FI 429, the tenth FI 430, the eleventh FI 431, and the twelfth FI 432. The third current transport layer 413 is in physical contact with the thirteenth FI 433, the fourteenth FI 434, the fifteenth FI 435, the sixteenth FI 436, the seventeenth FI 437, the eighteenth FI 438, the nineteenth FI 439, and the twentieth FI 440. The first trivial insulator 451 is in physical contact with the first current transport layer 411 and the second current transport layer 412. The second trivial insulator 452 is in physical contact with the third current transport layer 413 and the second current transport layer 412.

The first FI 421, the third FI 423, the fifth FI 425, the seventh FI 427, the tenth FI 430, the twelfth FI 432, the fourteenth FI 434, the sixteenth FI 436, the seventeenth FI 437, and the nineteenth FI 439 have a magnetization in positive z direction. The remaining FIs have a magnetization in negative z direction, although these could be reversed in another embodiment.

A trivial insulator is an ordinary insulator having a band gap and no states within this gap. A trivial insulator is therefore defined as a material having a lack of edge or surface states on the material boundary in addition to having insulating energy gaps in the bulk. In that sense, a trivial insulator is opposite of a topological insulator. A trivial insulator has a Chern number of zero ("0"), meaning that a trivial insulator may not possess a QAHE. Trivial insulators include, but are not limited to, glass, porcelain, composite polymers, and most oxides.

In operation, the voltage source 490 applies an electric voltage (V) to the system. Then a current density ($\vec{J}$) begins to flow on the surface of the first current transport layer 411 as electrons are transported through the surfaces states. When the current density encounters the first FI 421 with magnetization in −z direction, the current is deflected to the +y direction by the QAHE after which it continues in the +x direction on the surface of first current transport layer 411. The islands of alternating magnetization orientation form a current loop, which concentrates the magnetic field $B_1$ created by the current into the region aligned with FI 421, FI 425, FI 429, FI 433, and FI 437. When the current density encounters the second ferromagnetic island 422 with magnetization in the positive z direction, the current is deflected to the −y direction by the QAHE after which it continues in the x direction. The islands of alternating magnetization orientation form a current loop, which concentrates the magnetic field $B_2$ created by the current into the region aligned with FI 422, H 426, FI 430, FI 434, and FI 438. Because the direction of the current flow in the second current loop is counterclockwise, the magnetic field $B_2$ is in the opposite direction from $B_1$. The current density continues to alternate around the subsequent ferromagnetic islands, additional magnetic fields $B_3$ and $B_4$ are created, as shown, where the magnetic field $B_3$ is opposite the magnetic field $B_4$.

The first contact plate 461 and the second contact plate 462 may be made from any material that can transmit the electric current from one current transport layer to another current transport layer. In one embodiment, the first contact plate 461 and the second contact plate 462 are made from gold. When the current reaches the end of the first current transport layer 411, it travels through the first contact plate 461 to the second current transport layer 422. The current follows through the second contact plate 422 and third contact plate 423 in the same fashion as described above. The magnetic field created by the current loops on each surface links magnetic flux through all surfaces, thus increasing total inductance according to a power law.

In alternative embodiments the number of current transport layers may be increased to increase the inductance. When the current (I) is passed through this design, the magnetic field created by the current loops on each surface links magnetic flux through all n surfaces increasing the total inductance by a factor of $n^2$.

In another embodiment, the direction of the current is from the third current transport layer 423 towards the first current transport layer 421. In an alternative embodiment, the direction of the magnetization created by the ferromagnetic islands is reversed. The magnitude of the magnetization has no influence on the QAHE or the AHE.

In a further embodiment, the first contact current transport layer 461 and the second contact current transport layer 462 may be made from a material capable of transmitting current. These materials include but are not limited to: metals, electrolytes, superconductors, semiconductors, plasmas, and some nonmetallic conductors such as graphite and conductive polymers, gold, copper, carbon nanotubes, silver, and aluminum.

Figure 5:
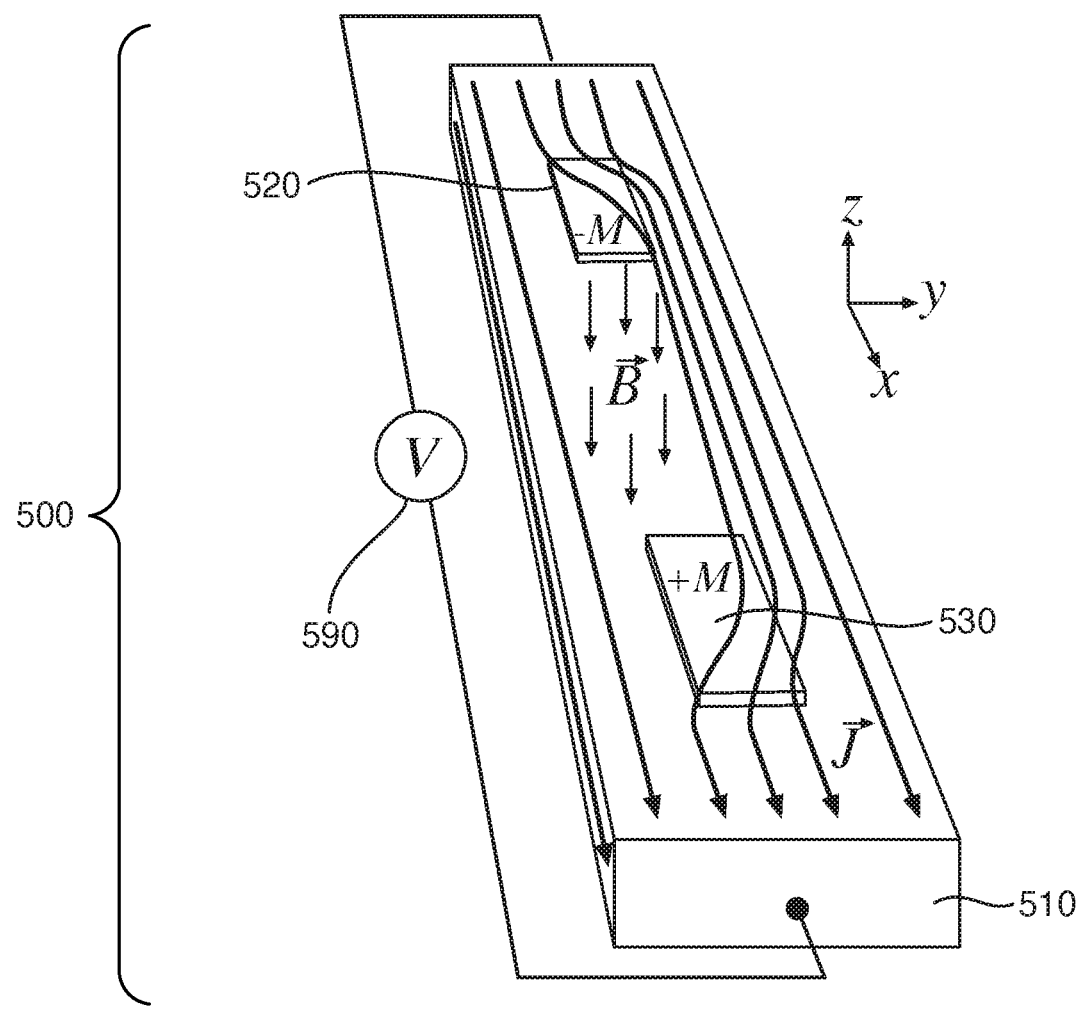
FIG. 5 is a diagram of a larger topological inductor, according to another embodiment of the present disclosure.

FIG. 5 is a diagram of a topological inductor 500, according to another embodiment of the present disclosure, which is larger than the topological inductor 100 by anywhere from one to $10^6$ times the size of the topological inductor 100. The topological inductor 500 includes a current transport layer 510, a first ferromagnetic island ("FI") 520, a second ferromagnetic island ("FI") 550, each placed on a current transport layer 510, and a voltage source 590 in electrical contact with either end of the current transport layer 510. In contrast to the topological inductor 100 of FIG. 2, the first FI 520 has a negative magnetization (towards the bulk) and the second FI 530 has a positive magnetization (away from the bulk), thus creating a differently-shaped magnetic flux between the FI's 520 and 530 as will be explained.

The first ferromagnetic island 520 and the second ferromagnetic island 530 are in physical contact with the current transport layer 510. The first ferromagnetic island 520 and the second ferromagnetic island 530 are on the same surface of the current transport layer 510. As mentioned, the first ferromagnetic island 520 has a magnetization in the negative z direction with a magnitude $M_1$, which is therefore expressed as $-M_1$. The second ferromagnetic island 530 has a magnetization in the positive z direction with a magnitude $M_2$, which is therefore expressed as $+M_2$.

Figure 6:
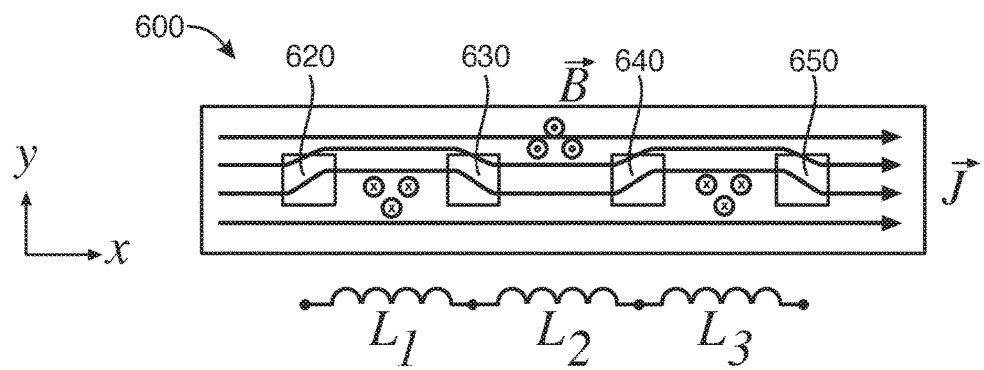
FIG. 6 is a diagram of a set of the larger topological inductors connected in series to increase the inductance of an on-chip topological inductor, according to an embodiment of the present disclosure.

In one embodiment, the magnitude of the first magnetic field $M_1$ and the magnitude of the second magnetic field $M_2$ are substantially the same. In another embodiment, the magnitude of the first magnetic field $M_1$ and the magnitude of the second magnetic field $M_2$ differ. The relative strengths of the ferromagnetic islands may vary depending on design of the topological inductor 500. As shown by way of example in FIG. 6, and discussed more fully below, the ferromagnetic islands form a current loop as the current is first pushed in a +y direction then pushed in a −y direction, while also moving in a +x direction. In this larger topological inductor 500, there may be significant electron scattering, and therefore, the electrical potential may decrease slowly from the first FI 520 to the second FI 530, resulting in a gradient in the electric potential over the region where the ferromagnetic islands are located. When there is a potential gradient across the ferromagnetic islands, the current may flow diagonally across at least a portion of the ferromagnetic islands, as illustrated in FIGS. 5-6, instead of around their perimeters, as illustrated in FIGS. 2-3 of a nanoscale topological inductor.

While there are no strict limits on the overall strength of the magnetizations, $M_1$ and $M_2$, as the physical effect is present for all magnetization strengths, there are several design parameters that allow for preferred operation of the topological inductor 500. For example, the strengths of the relative magnetizations should be larger than the proposed temperature of operation ($3k_bT$) so as to have a magnetization gap in the surface states that is immune to thermal fluctuations. Should the desired mode of operation use the QAHE, then the strengths of the relative magnetizations should be sufficiently large so as to place the Fermi level within the created magnetization gap.

In one embodiment, the first ferromagnetic island 520 and the second ferromagnetic island 530 have substantially the same coordinates on the y direction. In other words, the ferromagnetic islands are approximately the same distance away from the edge of the current transport layer 510, which is parallel to the y-axis shown in the FIG. 5. In order to optimize the operation of the inductor, the ferromagnetic islands may be aligned in a linearly-ordered fashion so as to maximize the stored magnetic energy.

An electric field is applied across the current transport layer 510 in the x direction as illustrated in the FIG. 5, through the application of a voltage, V, then a current density, $\vec{J}$, begins to flow on the surface of the current transport layer 510 as electrons are transported through the surfaces states. When the current density encounters the first ferromagnetic island 520 with magnetization −M, the current is deflected to the +y direction by the QAHE after which it continues in the x direction. When the current density encounters the second ferromagnetic island 530 with magnetization +M, the current is deflected to the −y direction by the QAHE after which it continues in the x direction. The islands of alternating magnetization orientation effectively form a current loop, which concentrates the magnetic field $\vec{B}$ created by the current into the region separating the two ferromagnetic islands. The concentration of magnetic flux and thus magnetic energy by the topological inductor translates into a greater inductance for the device. The magnetic field $\vec{B}$ is created by the principle underlying inductors as explained above.

As discussed, the magnetic field energy, $E_B$, is computed from the magnetic field as $E_B=\int B \cdot B/\mu \, dV$, where the integral is computed over the device active region, $\vec{B}$ is the magnetic field and $\mu$ is the magnetic permeability of a material. The inductance, L, may then be derived as $L=2E_B/I^2$, where I is the current flowing through the system as supplied by the voltage source 390.

FIG. 6 is a diagram of a set of the larger topological inductors 500 connected in series (e.g., a series-connected topological inductor 600) to increase the inductance of an on-chip topological inductor according to an embodiment of the present disclosure. For example, the series-connected topological inductor 600 may include a first ferromagnetic island 620, a second ferromagnetic island 630, a third ferromagnetic island 640, and a fourth ferromagnetic island 650 to produce topological inductances $L_1$, $L_2$, and $L_3$, respectively. Accordingly, for example, FI's 620 and 630 may produce topological inductor $L_1$, FI's 630 and 640 may produce topological inductor $L_2$, and FI's 640 and 650 may produce topological inductor $L_3$. The magnetic field, $\vec{B}$, may be generated into the page for $L_1$ and $L_3$, and out of the page for $L_2$, although the opposite could be true in another embodiment.

Accordingly, a plurality of topological inductors 100 or 300 may be arranged to form a series circuit. A topological inductor is said to form a series circuit when the positive terminal of a first topological inductor is electronically connected to a negative terminal of a second topological inductor. In an alternative embodiment, a plurality of topological inductors 100 or 300 may be arranged to form a parallel circuit, which may be designed to reduce inductance. A topological inductor is said to form a parallel circuit when the positive terminal of a first topological inductor is electronically connected to the positive terminal of a second topological inductor, and the negative terminal of the first topological inductor is electronically connected to the negative terminal of the second topological inductor.

Figure 7:
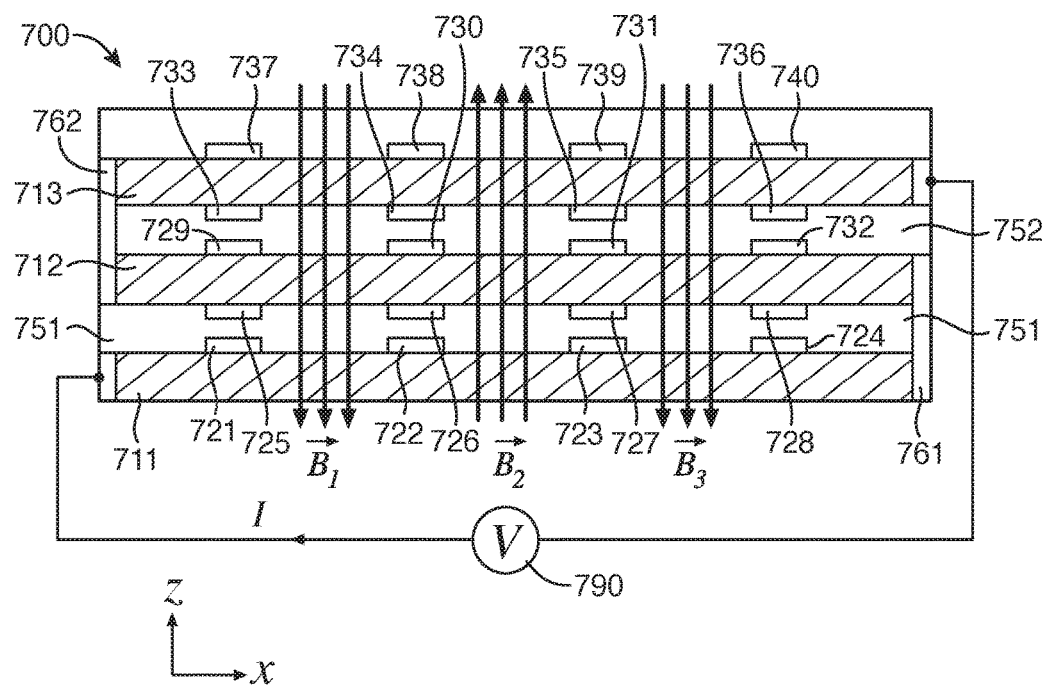
FIG. 7 is a diagram of a multi-layered set of the larger topological inductors connected in series to increase flux linkages between the series topological inductors, according to an embodiment of the present disclosure.

FIG. 7 is a diagram of a multi-layered set of topological inductors 700 connected in series to increase flux linkages between the series topological inductors according to an embodiment of the present disclosure. The disclosed topological inductors may be stacked in various combinations to produce the inductance. There is no theoretical limit to the number of topological inductors that can be stacked to achieve a desired inductance. Note that, similar to FIG. 6, the magnetic field, $\vec{B}$, may alternative in direction from series inductor to series inductor where the magnetization of the group flux-linked ferromagnetic islands (FI's) alternates as well.

The stacked topological inductor 700 includes a first current transport layer 711, a second current transport layer 712, a third current transport layer 713, a first ferromagnetic island (FI) 721, a second FI 722, a third FI 723, a fourth FI 724, a fifth FI 725, a sixth FI 726, a seventh FI 727, an eight FI 728, a ninth FI 729, a tenth FI 730, an eleventh FI 731, a twelfth FI 732, a thirteenth FI 733, a fourteenth FI 734, a fifteenth FI 735, a sixteenth FI 736, a seventeenth FI 737, an eighteenth FI 738, a nineteenth FI 739, a twentieth FI 740, a voltage source 790, a first trivial insulator 751, a second trivial insulator 752, a first contact plate 761, and a second contact plate 762.

In the stacked topological inductor 700, the voltage source 790 is in electrical contact with the first current transport layer 711 and the current transport layer 713. The first current transport layer 711 is in electrical contact with the second current transport layer 712 through the first contact plate 761. The second current transport layer 712 is in electrical contact with the third current transport layer 713 through the second contact plate 762. The first current transport layer 711 is in physical contact with the first FI 721, the second FI 722, the third FI 723, and the fourth FI 724. The second current transport layer 712 is in physical contact with the fifth FI 725, the sixth FI 726, the seventh FI 727, the eighth FI 728, the ninth FI 729, the tenth FI 730, the eleventh FI 731, and the twelfth FI 732. The third current transport layer 713 is in physical contact with the thirteenth FI 733, the fourteenth FI 734, the fifteenth FI 735, the sixteenth FI 736, the seventeenth FI 737, the eighteenth FI 738, the nineteenth FI 739, and the twentieth FI 740. The first trivial insulator 751 is in physical contact with the first current transport layer 711 and the second current transport layer 712. The second trivial insulator 752 is in physical contact with the third current transport layer 713 and the second current transport layer 712.

The first FI 721, the third FI 723, the fifth FI 725, the seventh FI 727, the tenth FI 730, the twelfth FI 732, the fourteenth FI 734, the sixteenth FI 736, the seventeenth FI 737, and the nineteenth FI 739 have a magnetization in positive z direction. The remaining FIs have a magnetization in negative z direction, although these could be reversed in another embodiment.

In operation, the voltage source 790 applies an electric voltage (V) to the system. Then a current density ($\vec{J}$) begins to flow on the surface of the first current transport layer 711 as electrons are transported through the surfaces states. When the current density encounters the first FI 721 with magnetization in −z direction, the current is deflected to the +y direction by the QAHE after which it continues in the +x direction on the surface of first current transport layer 711. When the current density encounters the second ferromagnetic island 722 with magnetization in the positive z direction, the current is deflected to the −y direction by the QAHE after which it continues in the x direction. The islands of alternating magnetization orientation form a current loop, which concentrates the magnetic field $B_1$ created by the current into the region separating the two ferromagnetic islands. When the current density encounters the third FI 723 with magnetization in the negative z direction, the current is deflected again to the +y direction by the QAHE after which it continues in the x direction on the surface of the first current transport layer 711. This forms a second current loop between the second FI 722 and the third FI 723. The current loop concentrates the magnetic field $B_2$ created by the current into the region separating the two ferromagnetic islands in the positive z direction. Because the direction of the current flow in the second current loop is counterclockwise, the magnetic field $B_2$ is in the opposite direction from $B_1$. The current density continues to alternate, creating additional current loops and at least a third magnetic field $B_3$, as illustrated.

The first contact plate 761 and the second contact plate 762 may be made from any material that can transmit the electric current from one current transport layer to another current transport layer. In one embodiment, the first contact plate 761 and the second contact plate 762 are made from gold. When the current reaches the end of the first current transport layer 711, it travels through the first contact plate 761 to the second current transport layer 722. The current follows through the second contact plate 722 and third contact plate 723 in the same fashion as described above. The magnetic field created by the current loops on each surface links magnetic flux through all surfaces, thus increasing total inductance according to a power law.

In alternative embodiments the number of current transport layers may be increased to increase the inductance. When the current (I) is passed through this design, the magnetic field created by the current loops on each surface links magnetic flux through all n surfaces increasing the total inductance by a factor of $n^2$.

In another embodiment, the direction of the current is from the third current transport layer 723 towards the first current transport layer 721. In an alternative embodiment, the direction of the magnetization created by the ferromagnetic islands is reversed. The magnitude of the magnetization has no influence on the QAHE or the AHE.

In various embodiments, a group of ferromagnetic islands may be formed in a square, round, oblong, or any other shape without deviating from the scope of the present disclosure. There is no maximum limit on the side length of the ferromagnetic island. The islands may be arranged symmetrically, off center, in multiple rows, staggered, be present on side and bottom walls, be present in any shape current transport layer for example, a circular or wire shaped current transport layer. FIGS. 8-15 show examples of some embodiments, which are for example purposes only, and are not meant to be limiting. The robustness of the device of the present disclosure allows for variety in the size, shape, and placement of ferromagnetic islands and current transport layers.

Figure 8:
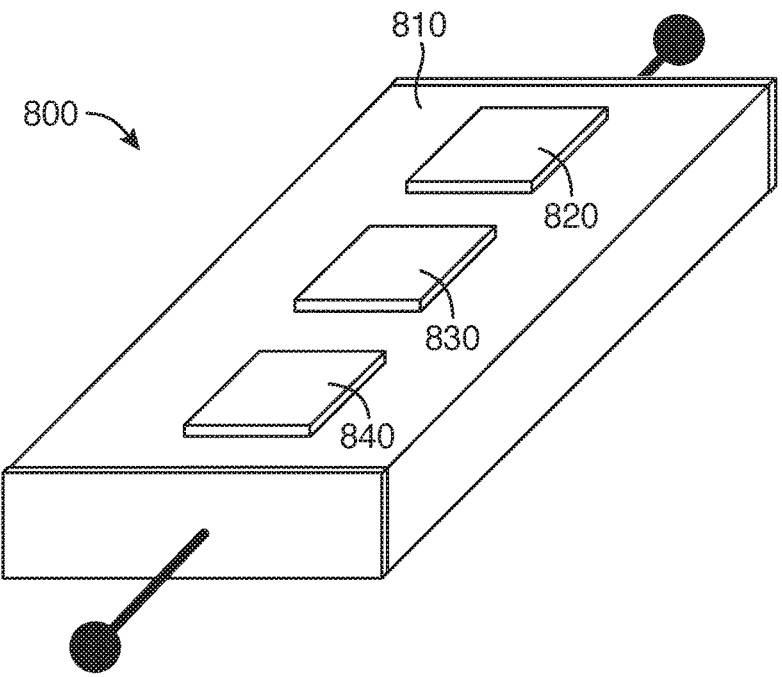
FIG. 8 is a perspective view of a topological inductor having symmetrical placement of ferromagnetic islands on a current transport layer, according to an embodiment of the present disclosure.

For example, FIG. 8 is a perspective view of a topological inductor 800 having symmetrical placement of ferromagnetic islands 820, 830, and 840 on a current transport layer 810, according to an embodiment of the present disclosure.

Figure 9:
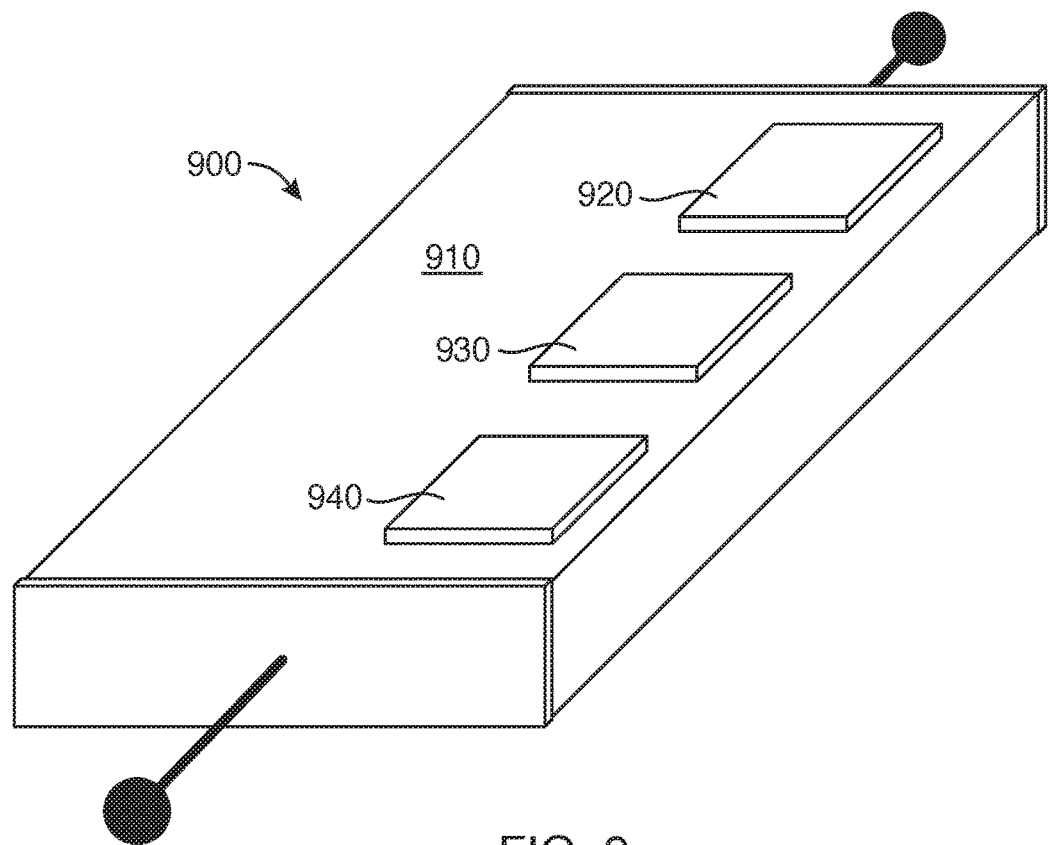
FIG. 9 is a perspective view of a topological inductor having off-center placement of ferromagnetic islands on a current transport layer, according to an embodiment of the present disclosure.

FIG. 9 is a perspective view of a topological inductor 900 having off-center placement of ferromagnetic islands 920, 930, and 940 on a current transport layer 910, according to an embodiment of the present disclosure.

Figure 10:
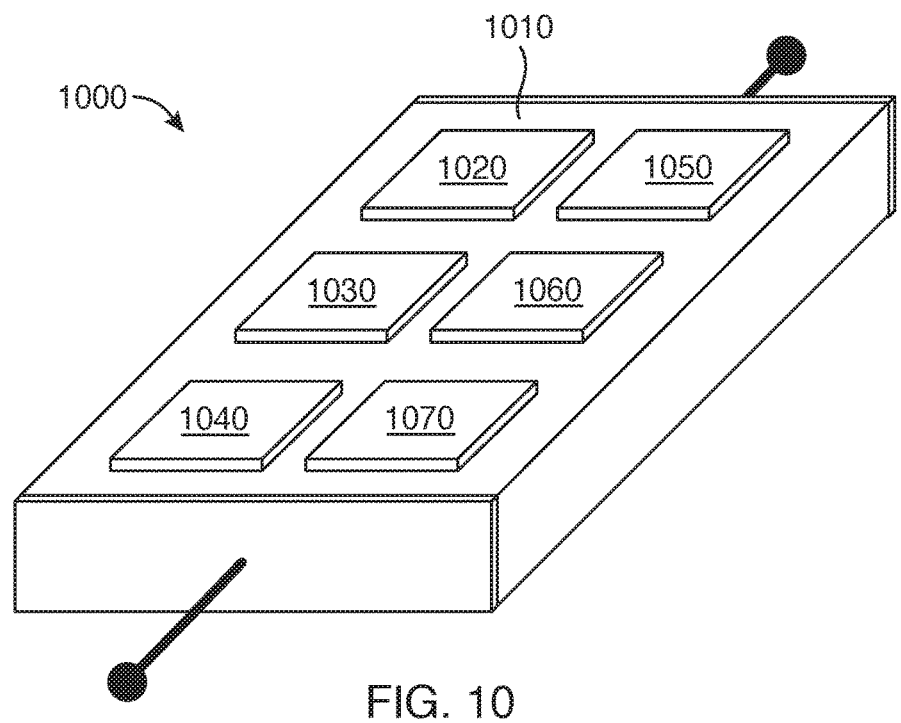
FIG. 10 is a perspective view of a topological inductor having multiple rows of ferromagnetic islands on a current transport layer, according to an embodiment of the present disclosure.

FIG. 10 is a perspective view of a topological inductor 1000 having multiple rows of ferromagnetic islands 1020, 1030, 1040, 1050, 1060, and 1070 on a current transport layer 1010, according to an embodiment of the present disclosure.

Figure 11:
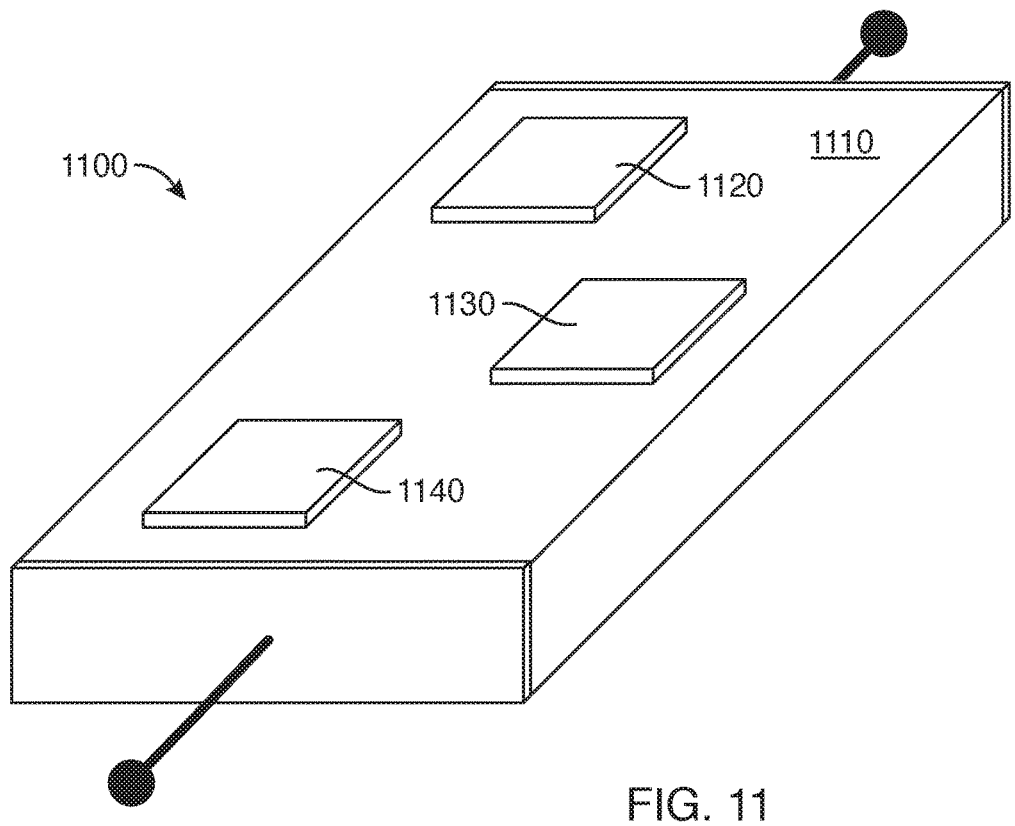
FIG. 11 is a perspective view of a topological inductor having staggered placement of ferromagnetic islands on a current transport layer, according to an embodiment of the present disclosure.

FIG. 11 is a perspective view of a topological inductor 1100 having staggered placement of ferromagnetic islands 1120, 1130, and 1140 on a current transport layer 1110, according to an embodiment of the present disclosure.

FIG. 12 is a perspective view of a topological inductor 1200 having oblong-shaped ferromagnetic islands 1220, 1230, and 1240 on a current transport layer 1210, according to an embodiment of the present disclosure.

FIGS. 13A and 13B are perspective views of a topological inductor 1300 having ferromagnetic islands 1320, 1330, and 1340 placed on both the top 1310A of a current transport layer 1310, ferromagnetic islands 1350, 1360, and 1370 placed on a side 1310B of the current transport layer 1310, and ferromagnetic islands 1372, 1374, and 1376 placed on a bottom 1310C of the current transport layer 1310, according to an embodiment of the present disclosure. The ferromagnetic islands are shown as squares, but can be of any shape.

Figure 14:
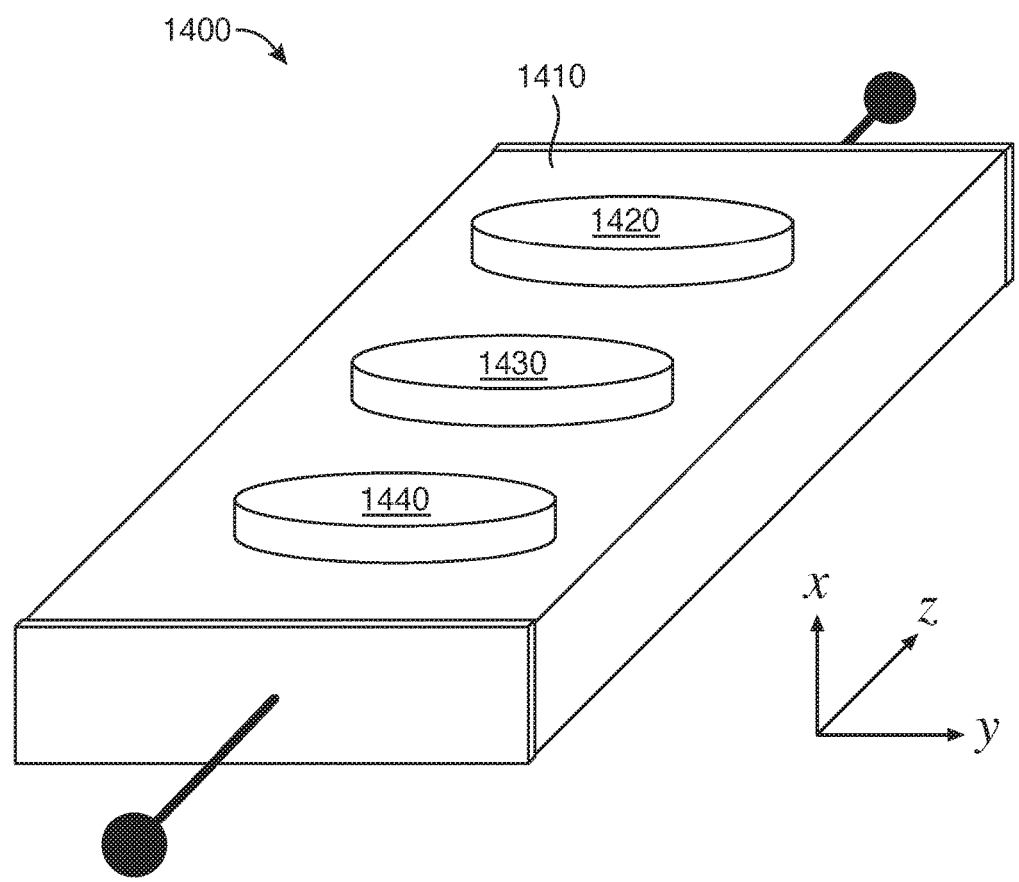
FIG. 14 is a perspective view of a topological inductor having oval-shaped ferromagnetic islands placed on a current transport layer, according to an embodiment of the present disclosure.

FIG. 14 is a perspective view of a topological inductor 1400 having oval-shaped ferromagnetic islands 1420, 1430, and 1440 placed on a current transport layer 1410, according to an embodiment of the present disclosure.

Figure 15:
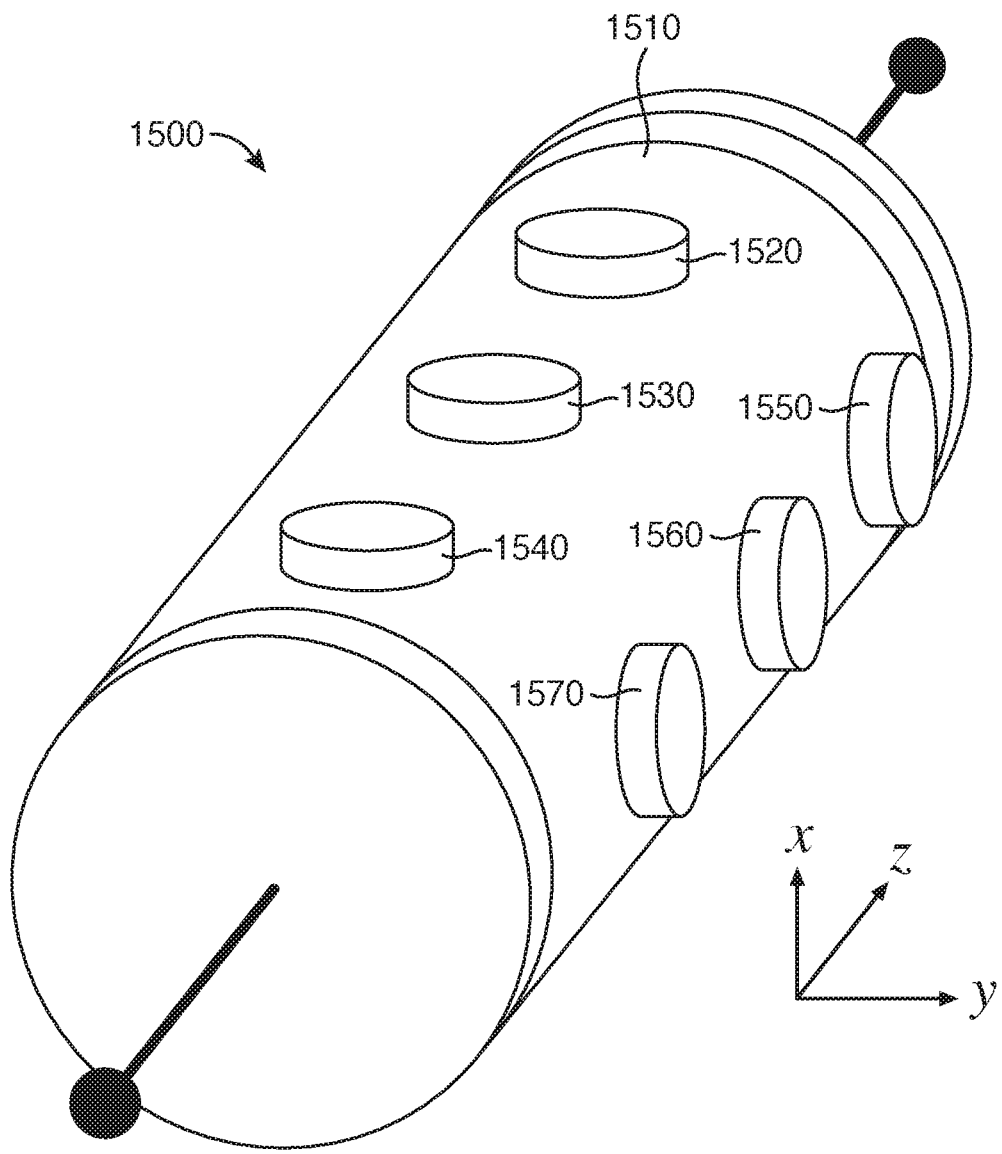
FIG. 15 is a perspective view of a topological inductor having ferromagnetic islands on a cylindrical-shaped current transport layer, according to one embodiment of the present disclosure.

FIG. 15 is a perspective view of a topological inductor 1500 having ferromagnetic islands 1520, 1530, 1540, 1550, 1560, and 1570 on a cylindrical-shaped current transport layer 1510, which in one embodiment may be a wire, according to one embodiment of the present disclosure.

Numerical Simulation

The efficacy of the topological inductor may be verified by simulating the topological inductor using a new method that couples AC quantum transport self-consistently in conjunction with a full electrodynamic solution of Maxwell's equations, as defined below. A fully quantum treatment of transport allows the capture the topological nature of the QAHE and AHE at nanoscale that is integral to the device function, but since inductance is a classical electromagnetic quantity, the solution of Maxwell's equations is sufficient. Quantum transport is simulated using the AC non-equilibrium Green function (NEGF) technique, which computes the first-order response of a device Hamiltonian to an AC driving voltage. Since inductance relies on dynamic flux linking generated by Faraday's law, simply solving Poisson's equation for electrostatics as is typical for DC NEGF is not adequate. As such, the computed currents and charge density from AC NEGF are input into a fully dynamic finite-difference frequency-domain (FDFD) electromagnetics simulation. The output potentials of the FDFD simulation are then fed back into the AC NEGF method, and the feedback process is iterated until the error in the scalar potential between successive iteration is less than 1 μV, which is defined as the criterion to reach self-consistency. This procedure is used to accurately evaluate the inductance of the design.

The topological inductor systems are modeled by a tight-binding Hamiltonian with nearest neighbor hopping given by $$\mathcal{H}(r) = \sum_r \left[ \psi_r^\dagger H_0 \psi_r + \sum_\delta (\psi_r^\dagger H_\delta \psi_{r+\delta} + H.c.) \right], \quad (2)$$

where $\psi_r$ is the electron annihilation operator, and $\delta=(\pm a\hat{x}, \pm a\hat{y}, \pm a\hat{z})$ are the distances between nearest neighbor atoms on the lattice with lattice constant $\alpha=1$ Å. The three-dimensional 3D TRI topological insulator Hamiltonian requires a basis of two orbital and two spins resulting in the on-site term:

$$H_0 = \mathbb{M}\,T^0 + M(r)\Gamma_M - eV(r)I_4, \qquad (3)$$

where $\Gamma^0 = \tau^z \otimes I_2$, $\Gamma_M = I_2 \otimes \sigma^i$, $\tau^i$ are the orbital Pauli matrices, $\sigma^i$ are the spin Pauli matrices, $I_N$ is the N×N identity matrix, and $\mathbb{M} = m - 3b/a^2$. Here, m and b are parameters that can be tuned to fit characteristics of a time-reversal-invariant 3D topological insulator. The spatially-varying Zeeman field generated by a surface-perpendicular ferromagnet is added through M(r), and the scalar electromagnetic potential profile is incorporated through V(r). The hopping term for this model is given by $$H_\delta = \frac{b\Gamma^0 + i\gamma\delta\cdot\Gamma}{2a^2}\exp\left(\frac{ie}{\hbar}\int_r^{r+\delta} A(r)\cdot d\ell\right). \qquad (4)$$

Here, $\Gamma^i = \tau^x \otimes \sigma^i$ ($i \in \{x,y,z\}$), $\Gamma = (\Gamma^x\,\hat{x}, \Gamma^y\,\hat{y}, \Gamma^z\,\hat{z})$, e is the electron charge, $\hbar$ is the reduced Planck's constant, and $\gamma$ is an additional tunable parameter. The vector potential A(r) enters through the Peierl's phase in this hopping term.

This model Hamiltonian reproduces the low energy physics of a TI including the anomalous Hall effect (AHE) and the quantum anomalous Hall effect (QAHE) by preserving the same symmetries of a time-reversal-invariant TI and obeying the proper Clifford algebra. To understand the qualitative transport features of a TI, the parameters m=1.5 eV, b=1 eV$Å^2$, and $\gamma=1$ eVÅ are set to create a bulk band gap of 1 eV that highly localizes the surface states such that they do not hybridize even at nanometer dimensions.

The retarded Green function, that is, the impulse response of the system Hamiltonian, at energy E can be expressed as $$G^r(E) = G_0^r(E) + G_\omega^r(E), \qquad (5)$$

where $G_0^r(E)$ is the DC retarded Green function and $G_\omega^r(E)$ is first-order response due to an AC perturbation. The DC Green function is calculated via the standard NEGF formalism by $$G_0^r(E) = [E - i\eta - \mathcal{H} - U - \Sigma_0^r(E)]^{-1}, \qquad (6)$$

where U is the potential energy profile, $\eta$ is an infinitesimal positive number that pushes the poles of the Green function into the complex plane, allowing for integration along the real energy axis, and $\Sigma_0^r(E)$ is the contact self-energy that integrates out the influence of the semi-infinite leads. The wide bandwidth limit (WBL) is assumed, where the contacts have a much larger bandwidth than the device with a constant density of states as a function of energy. This assumption results in a retarded self-energy of the form $\Sigma_0^r(E) = i\Gamma$, where $\Gamma$ is the energy level broadening introduced by the leads. As the contacts are typically much larger than the device region, the WBL is a valid assumption as the number of available states in the lead should not vary greatly over biases and frequencies much less than the bandwidth of the metallic contact.

Since the AC bias is introduced perturbatively, the small-signal retarded AC Green function $G_\omega^r(E)$ at frequency w is expressed as a product of DC Green functions at energies E and $E+\hbar\omega$:

$$G_\omega^r(E) = G_0^r(E+\hbar\omega)[-eV(\omega) + \Sigma_\omega^r(E+\hbar\omega, E)]G_0^r(E). \qquad (7)$$

Here $V(\omega)$ is the AC potential profile and $\Sigma_\omega^r(E)$ is the AC contact self-energy. Just as the AC Green function is the small-signal perturbation to the DC Green function, the total contact self-energy can be expressed as $$\Sigma^\gamma(E) = \Sigma_0^\gamma(E) + \Sigma_\omega^\gamma(E) \quad (\gamma = r, <), \qquad (8)$$

where $\Sigma_\omega^\gamma(E)$ is the AC self-energy due to a perturbative bias of the form $V(t) = V_{AC}\cos\omega t$, where $V_{AC}$ is the amplitude of the AC driving voltage. The AC contact self-energy is similarly a function of the DC contact self-energies and is calculated as $$\sum\nolimits_\omega^\gamma (E) = \frac{eV_{AC}}{\hbar\omega}\left[\sum\nolimits_0^\gamma (E) - \sum\nolimits_0^\gamma (E+\hbar\omega)\right] \quad (\gamma = r, <), \qquad (9)$$

where e is the electron charge. In the WBL, the AC retarded self-energy greatly simplifies to $\Sigma_\omega^r(E) = 0$. Although the WBL provides an accurate description of large reservoir contacts for small energy scales, it neglects the nontrivial energy dependence of the contact self-energy at high frequencies where $\hbar\omega$ is no longer small and $[\Sigma_0^\gamma(E) - \Sigma_0^\gamma(E+\hbar\omega)] \neq 0$, which can result in unphysical charge accumulation. However, for small frequencies, where $\hbar\omega \ll 1$ and $[\Sigma_0^\gamma(E) - \Sigma_0^{\gamma(E+\hbar\omega)}] \sim 0$, the WBL can be safely applied to model the AC self-energy of metallic leads.

In order to account for the application of a bias, the retarded Green function must be convolved with the lesser self-energy $\Sigma_0^<(E)$, which accounts for the occupancy of the leads, using the Keldysh equation $G^<(E) = G^r(E)\Sigma^<(E)G^r(E)^\dagger$. After applying the definitions in Equations (6) and (8) and taking only the terms that are first-order in the perturbation, the expression for the AC lesser Green function is $$G_\omega^<(E) = G_0^r(E+\hbar\omega)\Sigma_0^<(E+\hbar\omega)G_\omega^r(E)^{554} + G_0^r(E+\hbar\omega)\Sigma_\omega^<(E)G_0^r(E)^\dagger + G_\omega^r(E)\Sigma_0^<(E)G_0^r(E)^\dagger. \qquad (10)$$

In the WBL, the DC lesser self-energy takes the form $\Sigma_0^r(E) = i\Gamma f_c(E)$, where $f_c(E)$ are the Fermi-Dirac distributions for the contacts. By Eq. (9), the AC self-energy is then given by $$\sum\nolimits_\omega^< = -\frac{\varepsilon eV_{AC}\Gamma}{\hbar\omega}(f(E) - f(E+\hbar\omega)).$$

Observables can then be calculated from the lesser AC Green function in a fashion similar to DC NEGF. The frequency-dependent electron density $n_\omega(r)$ is calculated in a similar fashion to DC NEGF using $G_\omega^<(E)$:

$$n_\omega(r) = -i\int \frac{dE}{2\pi} G_{\omega;r,r}^<(E). \qquad (11)$$

While the electron density is important for charge dynamics, the current density contributes to the dynamic magnetic field in the inductor, and it is given by $$J_{\alpha,\omega}(r) = -\frac{e}{\hbar}\int \frac{dE}{2\pi}\left[H_{r+a_0\hat{\alpha},r}G_{\omega;r,r+a_0\hat{\alpha}}^<(E) - G_{\omega;r+a_0\hat{\alpha},r}^<(E)H_{r,r+a_0\hat{\alpha}}\right] \qquad (12)$$

$(\alpha = x, y, z).$

Lastly, the AC contact current in the WBL is computed from as $$I(\omega) = \frac{e}{\hbar} \int \frac{dE}{2\pi} [f(E) - f(E + \hbar\omega)] Tr[\Gamma_L G_0^r(E + \hbar\omega) \Gamma_R G_0^r(E)^\dagger]. \quad (13)$$

The AC NEGF method can be computationally expensive since two matrix inversions are needed at each step in the energy grid. Recursive methods, however, can speed up computation significantly.

Electromagnetics Solver. For situations where the operating frequency is much lower than the inverse of an electron's transit time across a device, the quasistatic approximation of the electrostatic potential using the solution of Poisson's equation provides adequate accuracy. Above these frequencies, a full solution of Maxwell's equation must be obtained to incorporate dynamic electromagnetic coupling. For inductors, however, whose operation is dependent on magnetic coupling of the currents in the device, Poisson's equation is also inadequate as it fails to capture the magnetic response of the magnetic response of the current density. Therefore, to capture both the electric charge effects and the magnetic inductive effects of the device, the fully dynamic solution of Maxwell's equations is required. While typical electromagnetics simulations solve directly for the electric field, E, and magnetic field, B, quantum mechanics relies on vector and scalar potentials. Therefore, instead of following the conventional approach, the scalar and vector potentials are directly solved for. In the frequency domain, the dynamic scalar potential V and vector potential A with frequency ω in the Lorenz gauge where $$\nabla \cdot A = -\frac{i\omega}{c} V,$$

resulting in the following governing equations:

$$\left(\nabla^2 + \frac{\omega^2}{c^2}\right) V = -\frac{\rho}{\varepsilon}, \quad (14)$$

$$\left(\nabla^2 + \frac{\omega^2}{c^2}\right) A = -\mu J, \quad (15)$$

where c is the speed of light, ε is the electric permittivity, and p is the magnetic permeability. The FDFD formulation solves these equations using finite differences on a Yee cell using the charge and current densities from the AC NEGF simulation. The electromagnetics domain is larger than the NEGF domain to accommodate absorbing boundary conditions that allow for field radiation and hinder the development of cavity modes. To reach self-consistency of this solution with the AC NEGF equation, the scalar and vector potentials are input back into the AC NEGF equations until the difference between the scalar potential on successive iterations is less than 1 μV.

Figure 16A:
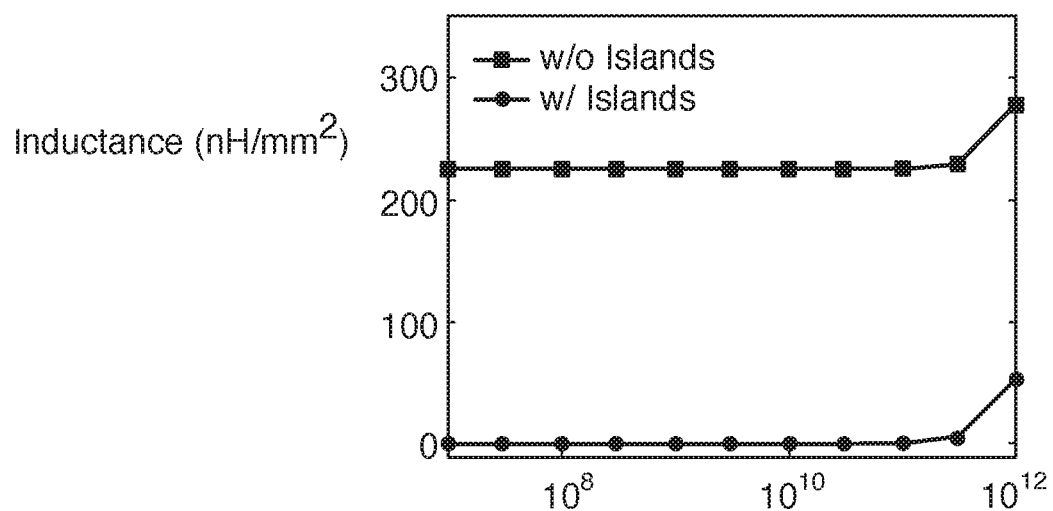
FIG. 16A is a graph illustrating a frequency response of a topological inductor with and without ferromagnetic islands (FIs), calculated using self-consistent alternating current (AC) non-equilibrium Green function (NEGF) simulation coupled to dynamic finite-difference frequency-domain (FDFD) solution of Maxwell's equations.

FIG. 16A illustrates a self-consistent simulation of the present topological conductor design over a frequency range from 10 MHz to 1 THz. The topological inductor is a 1.2 nm by 1 nm by 0.5 nm sample of a 3D TRI topological insulator model Hamiltonian that has a bulk band gap of 1 eV. Square FIs are placed on the top surface with side length of 0.3 nm, separation of 0.2 nm, and M–±0.2 eV. The chemical potential may be set to 0.1 eV to be below the magnetic gap to take full advantage of the QAHE. Not only does the topological inductor demonstrate an inductance of 225 nH/mm$^2$, but the topological inductor sustains this performance over the entire frequency range. Without the FIs, the AHM surface states naturally have an inductance density less than a pH/mm$^2$, which demonstrates the dramatic increase the FIs can have on energy transduction. Notably, at high frequencies near 1 THz, observed is an increase in the inductance both with and without islands. At such high frequencies, spurious fields at the contacts caused by the violation of Gauss's law become prominent, resulting in an artificial increase in the magnetic field and inductance.

Figure 16B:
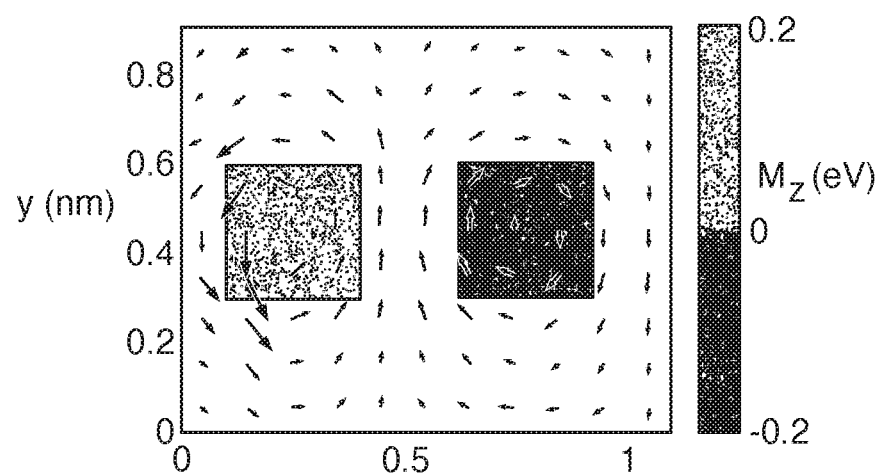
FIG. 16B is a graph illustrating a self-consistent alternate current (AC) NEGF simulation of the AC current density in the top surface of the topological inductor (with FI's indicated by a shade bar) of FIG. 19A under an AC bias of 10 mV.
Figure 16C:
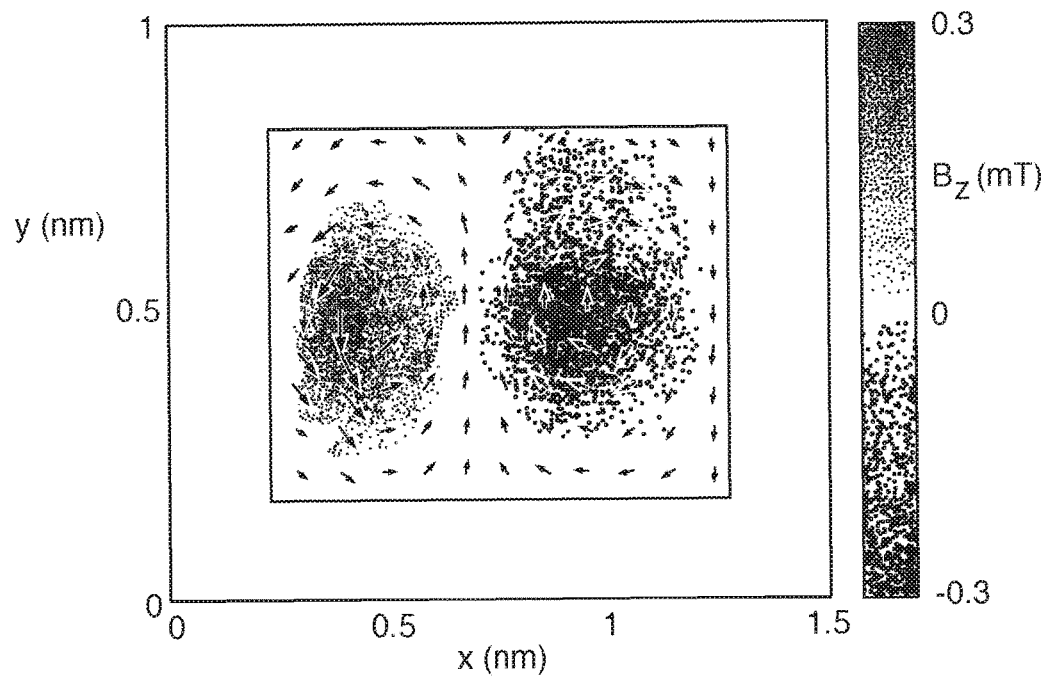
FIG. 16C is a graph illustrating a resulting z-directed magnetic flux density ($B_z$) of the topological inductor of FIG. 19B under an AC bias of 10 mV, according to an embodiment of the present disclosure.

FIG. 16B illustrates the current density profile around the ferromagnetic islands. As expected, the AC current density circulates around the ferromagnetic islands due to the QAHE, which generates the high magnetic fields over the islands as shown in FIG. 16C. In reality, the chemical potential cannot always be arbitrarily placed, so one should understand how its position may affect the topological inductor's performance.

Figure 16D:
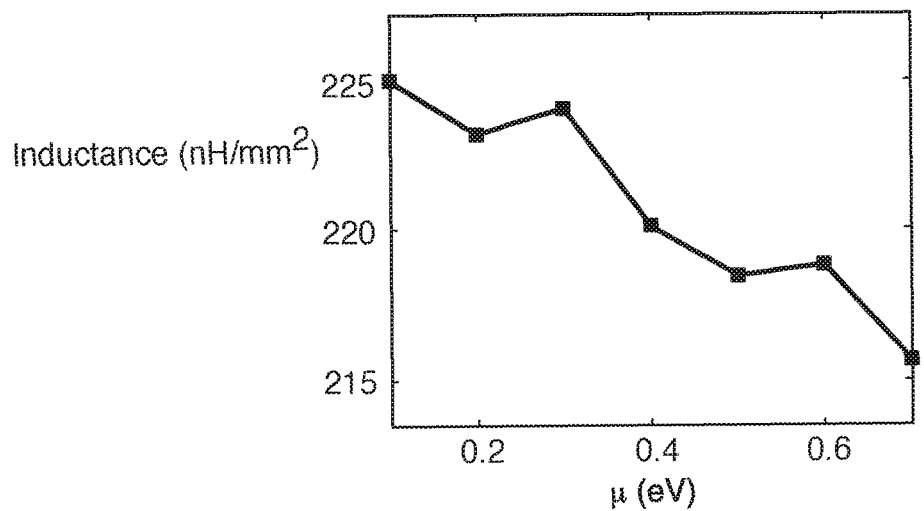
FIG. 16D is a graph illustrating an inductance of the topological inductor (with FI's) of FIG. 16B at a frequency of 10 GHz as a function of chemical potential, according to an embodiment of the present disclosure.

FIG. 16D illustrates the inductance as a function of chemical potential μ at a frequency of 10 GHz. Note that once the chemical potential is greater than the magnetic band gap of 0.2 eV, the inductance decreases. In this regime, the Hall current is no longer required to be quantized through edge channels and the AHE is observed as the chemical potential now crosses the higher energy surface band and is no longer within the magnetic gap.

Figure 16E:
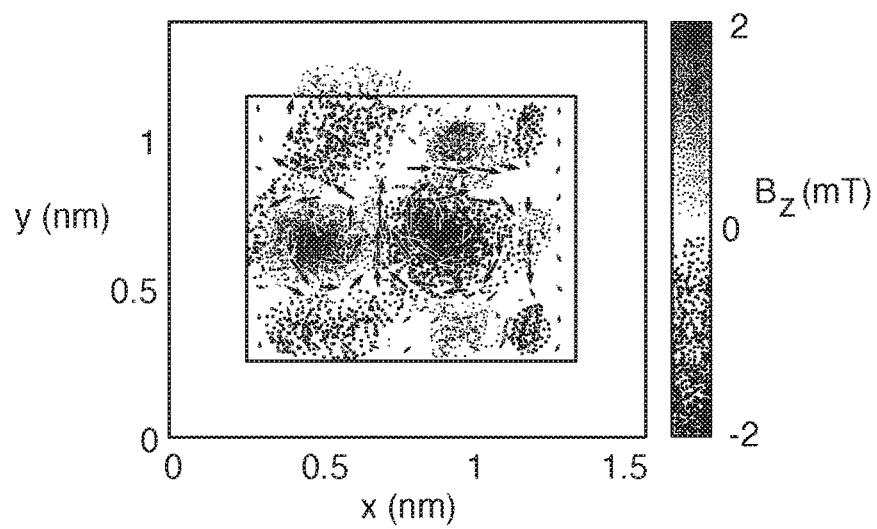
FIG. 16E is a graph illustrating a current distribution and magnetic flux density ($B_z$) of the top surface of the topological inductor of FIG. 19B when the chemical potential is equal to 0.7 electron-volts (eV), according to an embodiment of the present disclosure.

FIG. 16E illustrates the magnetic field profile for μ=0.7 eV where there is significantly more current over the island area and stronger magnetic fields because the islands are now conductive regions. As the chemical potential rises through the surface state band, the AHE creates a large increase in the magnetic flux that is generated through the islands, but the increased carrier density and thus increased output current result in a net reduction in the device's inductance. Lastly, simulations were performed on a larger structure that is 3.2 nm long to understand the effect of the spacing between the islands on the performance of the inductor.

Figure 16F:
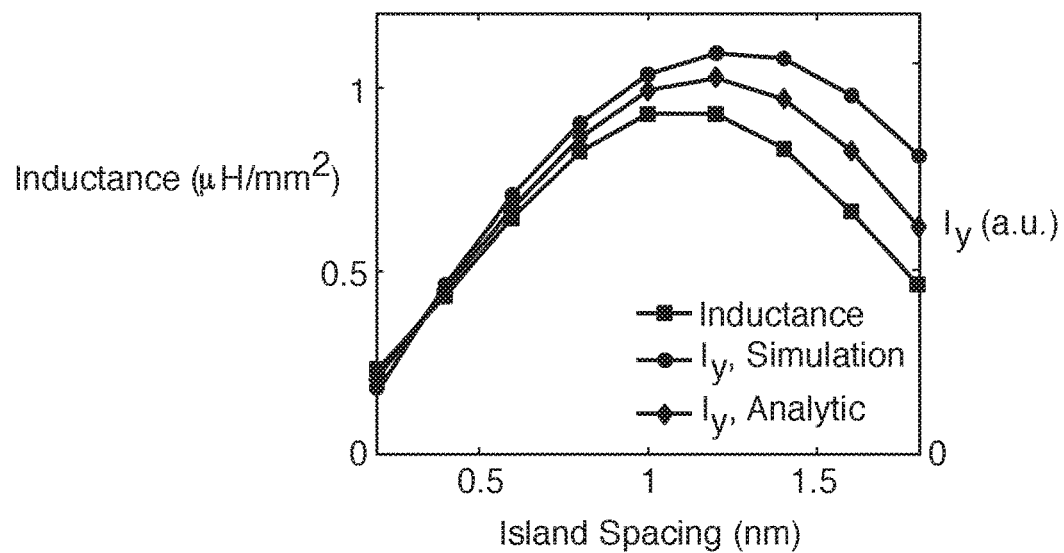
FIG. 16F is a graph illustrating inductance and current between the FIs of the topological inductor of FIG. 18B as a function of spacing between the ferromagnetic islands, according to an embodiment of the present disclosure.

In FIG. 16F, in a plot of the inductance of the design with 0.3 nm side length islands and island spacing ranging from 0.2 nm to 1.7 nm, note that the inductance peaks at 930 nH/mm2 at a spacing of 1.2 nm. Since the field generated through the ferromagnetic islands is a function of the current around the islands, it follows that the inductance is maximized when the current between the ferromagnetic islands is maximized. In the supplementary information, the wave function is determined as is the current between the islands by approximating the islands as two semi-infinite regions of magnetization. The current density may vary sinusoidally between the ferromagnetic islands, leading to a spatially periodic current density. The analytic and simulated current is plotted between the islands $I_y$ alongside the inductance FIG. 16F to illustrate the strong agreement of the behavior of the current and inductance under varying ferromagnetic island spacing.

Influence of Ferromagnetic Island Spacing

Figure 17:
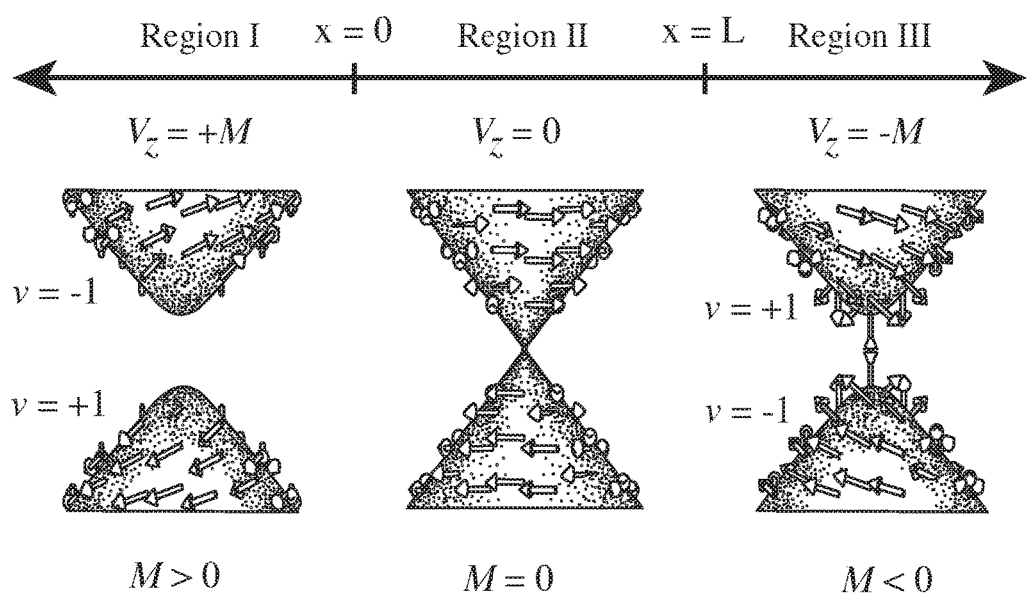
FIG. 17 is a graph illustrating approximation of the space between ferromagnetic islands as a region without magnetization between two semi-infinite regions of ±M magnetization.

To understand the ideal ferromagnetic island spacing for the topological inductor, the wave function of the surface state of a 3D TRI topological insulator between two semi-infinite regions of magnetization as depicted in FIG. 17 is determined. The low-energy momentum-space surface state Hamiltonian is given by $$H = v_F p_x \sigma^y - v_F p_y \sigma^x + V_z \sigma^z, \quad (16)$$

where $p_i$ are momenta, $\sigma^i$ are the spin Pauli matrices, and $V_z$ is the Zeeman field. To obtain a spatially varying Zeeman field, take the Hamiltonian in real-space given by $$H = -i\hbar v_F \partial_x \sigma^y + i\hbar v_F \overline{\partial}_y \sigma^x + V_z(x) \sigma^z. \quad (17)$$

where $\hbar$ is Planck's constant. Here, the Zeeman field varies in the x direction. Next, solve for a system as indicated in FIG. 17 where the Zeeman field is a step-wise function of position as $$V_x(x) = \begin{cases} +M & x < 0 \quad \text{(Region } I\text{)} \\ 0 & 0 \leq x < L \quad \text{(Region } II\text{)} \\ -M & x > L \quad \text{(Region } III\text{)} \end{cases} \quad (18)$$

This process allows construction of an ansatz wave function for the three regions in FIG. 17. Assume $\hbar = v_f = 1$ for the proceeding, but units will be restored later.

$$\Psi_I(x) = \alpha \begin{pmatrix} 1 \\ \dfrac{\kappa_x - p_y}{E + V_z} \end{pmatrix} e^{\kappa_x x + i p_y y} \quad (19)$$

$$\Psi_{II}(x) = A_1 \begin{pmatrix} 1 \\ \dfrac{-ip_x - p_y}{E} \end{pmatrix} e^{ip_x x + i p_y y} + A_2 \begin{pmatrix} 1 \\ \dfrac{ip_x - p_y}{E} \end{pmatrix} e^{-ip_x x + i p_y y} \quad (20)$$

$$\Psi_{III}(x) = \beta \begin{pmatrix} 1 \\ \dfrac{-\kappa_x - p_y}{E + V_z} \end{pmatrix} e^{-\kappa_x x + i p_y y}. \quad (21)$$

Since the wave functions within the magnetic domains in regions I and III are exponentially damped and should not vary with the spacing, assume a focus on region II. In the DC case, the $\hat{x}$ momentum is much larger than the $\hat{y}$ momentum due to the x-directed electric field. Therefore by demanding spinor continuity at the interfaces and taking the limit $p_x \gg p_y$, the wave function is simplified to the form $$\Psi_{II}(x) = \\ \dfrac{2A_2}{p_x(E+V_z) + iE\kappa_x} \begin{pmatrix} p_x(E+V_z)\cos(p_x x) - 2E\kappa_x \sin(p_x x) \\ \dfrac{p_x}{E}[2E\kappa_x \cos(p_x x) + p_x(E+V_z)\sin(p_x x)] \end{pmatrix} \quad (22)$$

The y-directed current density between the ferromagnetic islands can then be found to be proportional to the y-directed velocity given as $\langle v_y \rangle = -v_F \langle \psi_{11} | \sigma^x | \psi_{11} \rangle$. After restoring units, note that the velocity can be expressed as $$\langle v_y \rangle = -\dfrac{4\hbar v_F^2 |A_2|^2}{\kappa_x} \Bigg\{ \dfrac{p_x^2(E+V_z)^2}{p_x^2(E+V_z)^2 + (p_y V_z + E\kappa_x)^2} \dfrac{(\kappa_x - p_y)}{E + V_z} + \\ \dfrac{\kappa_x}{E p_x^2(E+V_z)^2 + E^3 \kappa_x^2}\left[\sin^2(p_x L/\hbar)\right. \\ (p_x(E+V_z) - E\kappa_x)(E(\kappa_x + p_x) + p_x V_z) + E\kappa_x p_x(E+V_z) \\ \sin\!\left(2 p_x L, + \dfrac{\begin{pmatrix} p_x(E+V_z)\cos(p_x L/\hbar) - \\ (E\kappa_x + V_z p_y)\sin(p_x L/\hbar) \end{pmatrix}^2}{p_x^2(E+V_z)^2 + (p_y V_z + E\kappa_x)^2}\right) \dfrac{(-\kappa_x - p_y)}{E + V_z} \Bigg\} \quad (23)$$

The current density can then be simply calculated as $J = en(v_y)$. In this approximation, the velocity and thus current density profile between the magnetic domains varies sinusoidally as a function of position. For this system, $v_F = \{151930\}$ m/x, $M = 0.2$ eV and $E = \mu = 0.1$ eV resulting in an approximation that matches quite well with the peak of the inductance in FIG. 16F.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present embodiments are to be determined by the broadest permissible interpretation of the following claims and their equivalents, and shall not be restricted or limited by the foregoing detailed description. While various embodiments have been described, it will be apparent to those of ordinary skill in the art that many more embodiments and implementations are possible within the scope of the above detailed description. Accordingly, the embodiments are not to be restricted except in light of the attached claims and their equivalents, now presented or presented in a subsequent application claiming priority to this application.

What is claimed is:

1. An electrical device comprising:
   a current transport layer comprising an anomalous Hall material;
   a first ferromagnetic island in physical contact with the current transport layer; and
   a second ferromagnetic island in physical contact with the current transport layer, the second ferromagnetic island oriented with respect to the first ferromagnetic island such as to concentrate a magnetic field, generated by current flow along a conducting surface of the anomalous Hall material, over the first ferromagnetic island and the second ferromagnetic island.

2. The electrical device of claim 1, further comprising:
   an integrated circuit on which is deposited the current transport layer; and
   a voltage source connected to opposing ends of the current transport layer.

3. The electrical device of claim 1, wherein the first ferromagnetic island has a first magnetization and the second ferromagnetic island has a second magnetization oriented opposite to the first magnetization.

4. The electrical device of claim 1, further comprising one or more additional ferromagnetic islands coupled electrically in series with the first ferromagnetic and the second ferromagnetic island and in one of physical, electrical or magnetic contact with the current transport layer.

5. The electrical device of claim 1, wherein the anomalous Hall material has a non-zero Chern number.

6. The electrical device of claim 1, wherein the anomalous Hall material comprises one of: an anomalous Hall effect (AHE) material, a quantum anomalous Hall effect (QAHE) material, a topological insulator, a topological magnetic insulator, a quantum anomalous Hall (QAH) insulator, a Chern insulator, a Weyl or other topological semi-metal, a magnetic semiconductor, or a topological crystalline insulator.

7. The electrical device of claim 1, wherein the anomalous Hall material comprises at least one of: HgTe; $Bi_xSB_{1-x}$; $Sb_2Te_3$; $Bi_2Te_3$; $Bi_2Se_3$; $TlBiTe_2$; $TlBiSe_2$; $GeBi_4Te_7$; (In, Mn)As; (Ga, Mn)As; graphene, silicene, SnTe, $Pb_xSn_{1-x}Te$, $HgCr_2Se_4$, and TaAs.

8. The electrical device of claim 1, wherein the first ferromagnetic island has a first magnetization oriented perpendicular to the current transport layer and the second ferromagnetic island has a second magnetization oriented perpendicular to the current transport layer and opposite from the first magnetization.

9. The electrical device of claim 1, wherein the first ferromagnetic island and the second ferromagnetic island form a first inductor, further comprising a third ferromagnetic island in physical contact with the current transport layer and aligned generally along an axis formed between the first ferromagnetic island and the second ferromagnetic island, wherein the second ferromagnetic island and the third ferromagnetic island form a second inductor in series with the first inductor.

10. One of a radio frequency filter, a radio frequency amplifier, or an electrical transformer incorporating the electrical device of claim 1.

11. An electrical device comprising:
a first current transport layer comprising an anomalous Hall material;
a first ferromagnetic island in physical contact with the first current transport layer;
a second ferromagnetic island in physical contact with the first current transport layer and positioned such as to define a first region separating the first ferromagnetic island from the second ferromagnetic island on the first current transport layer;
a second current transport layer comprising an anomalous Hall material and electrically coupled to the first current transport layer;
a third ferromagnetic island in physical contact with the second current transport layer;
a fourth ferromagnetic island in physical contact with the second current transport layer and positioned such as to define a second region separating the third ferromagnetic island from the fourth ferromagnetic island on the second current transport layer; and
a trivial insulator positioned between the first current transport layer and the second transport layer.

12. The electrical device of claim 11, wherein the first ferromagnetic island is oriented opposite to the third ferromagnetic island across the trivial insulator and the second ferromagnetic island is oriented opposite to the fourth ferromagnetic island across the trivial insulator.

13. The electrical device of claim 11, further comprising:
a contact plate attached to an end of each of the first current transport layer and the second transport layer; and
a voltage source connected between a second end of each of the first current transport layer and the second transport layer.

14. The electrical device of claim 11, wherein the first ferromagnetic island has a first magnetization and the second ferromagnetic island has a second magnetization oriented opposite to the first magnetization, and wherein the third ferromagnetic island has the first magnetization and the second ferromagnetic island has the second magnetization oriented opposite to the first magnetization.

15. The electrical device of claim 14, wherein the first magnetization is substantially equal to the second magnetization.

16. The electrical device of claim 11, wherein the anomalous Hall material has a non-zero Chern number.

17. The electrical device of claim 11, wherein the anomalous Hall material comprises one of: an anomalous Hall effect (AHE) material, a quantum anomalous Hall effect (QAHE) material, a topological insulator, a topological magnetic insulator, a quantum anomalous Hall (QAH) insulator, a Chern insulator, a Weyl semi-metal, a magnetic semiconductor, or a topological crystalline insulator.

18. The electrical device of claim 11, wherein the anomalous Hall material comprises at least one of: HgTe; $Bi_xSB_{1-x}$; $Sb_2Te_3$; $Bi_2Te_3$; $Bi_2Se_3$; $TIBiTe_2$; $TIBiSe_2$; $GeBi_4Te_7$; (In, Mn)As; (Ga, Mn)As; graphene, silicene, SnTe, $Pb_xSn_{1-x}Te$, $HgCr_2Se_4$, or TaAs.

19. The electrical device of claim 11, wherein the first ferromagnetic island has a first magnetization oriented perpendicular to the first current transport layer and the second ferromagnetic island has a second magnetization oriented perpendicular to the first current transport layer and opposite from the first magnetization.

20. The electrical device of claim 11, wherein the third ferromagnetic island has a first magnetization oriented perpendicular to the second current transport layer and the fourth ferromagnetic island has a second magnetization oriented perpendicular to the second current transport layer and opposite from the first magnetization.

\* \* \* \* \*